(12) United States Patent
Higashi et al.

(10) Patent No.: US 8,730,638 B2
(45) Date of Patent: May 20, 2014

(54) LIGHTNING SURGE DETECTOR, SURGE PROTECTIVE DEVICE, AND MANAGEMENT SYSTEM FOR SURGE PROTECTIVE DEVICE

(75) Inventors: Shuji Higashi, Tokyo (JP); Yuichi Takahashi, Tokyo (JP); Kenichi Ebuchi, Tokyo (JP); Tsuyoshi Kawabata, Tokyo (JP)

(73) Assignee: Sankosha Corporation, Tokyo (JP)

( * ) Notice: Subject to any disclaimer, the term of this patent is extended or adjusted under 35 U.S.C. 154(b) by 171 days.

(21) Appl. No.: 13/560,053

(22) Filed: Jul. 27, 2012

(65) Prior Publication Data

US 2013/0083441 A1  Apr. 4, 2013

(30) Foreign Application Priority Data

Sep. 30, 2011 (JP) ................... 2011-217334

(51) Int. Cl.
*H02H 9/00* (2006.01)
(52) U.S. Cl.
USPC ........................................................ 361/117
(58) Field of Classification Search
USPC ........................................................ 361/117
See application file for complete search history.

(56) References Cited

U.S. PATENT DOCUMENTS

| | | | |
|---|---|---|---|
| 3,775,675 A | 11/1973 | Freeze et al. | |
| 3,889,185 A | 6/1975 | Wojtasinski et al. | |
| 5,446,431 A | 8/1995 | Leach et al. | |
| 8,239,150 B2* | 8/2012 | Baumheinrich et al. | 702/65 |
| 8,275,548 B2* | 9/2012 | Marshall et al. | 702/4 |
| 2011/0102767 A1 | 5/2011 | Volanthen et al. | |

FOREIGN PATENT DOCUMENTS

| | | |
|---|---|---|
| CN | 201904616 U | 7/2011 |
| EP | 0 848 395 A2 | 6/1998 |
| JP | 2005-150657 A | 6/2005 |
| JP | 2006-059888 A | 3/2006 |
| JP | 2006-098086 A | 4/2006 |
| JP | 2007-071845 A | 3/2007 |

* cited by examiner

*Primary Examiner* — Stephen W Jackson
(74) *Attorney, Agent, or Firm* — Carrier Blackman & Associates, P.C.; Joseph P. Carrier; William D. Blackman

(57) ABSTRACT

A lightning surge detector 1 includes a first terminal unit 3 connected to a ground-side terminal unit of a surge protective device, a second terminal unit 4 connected with a ground wire, a conducting coupling bar 5 adapted to couple the first terminal unit 1 and the second terminal unit 4, a detection coil 7 placed in a vicinity of the conducting coupling bar 5 and adapted to detect a lightning surge current flowing through the conducting coupling bar 5, a waveform processing unit adapted to stretch a voltage waveform of the detected lightning surge current and thereby output a waveform-modified voltage, a computation control unit adapted to produce a calculation result of the lightning surge current from the waveform-modified voltage, and a display unit 40 adapted to display the calculation result, wherein all the above components are unitized by being housed in a casing 2.

7 Claims, 22 Drawing Sheets

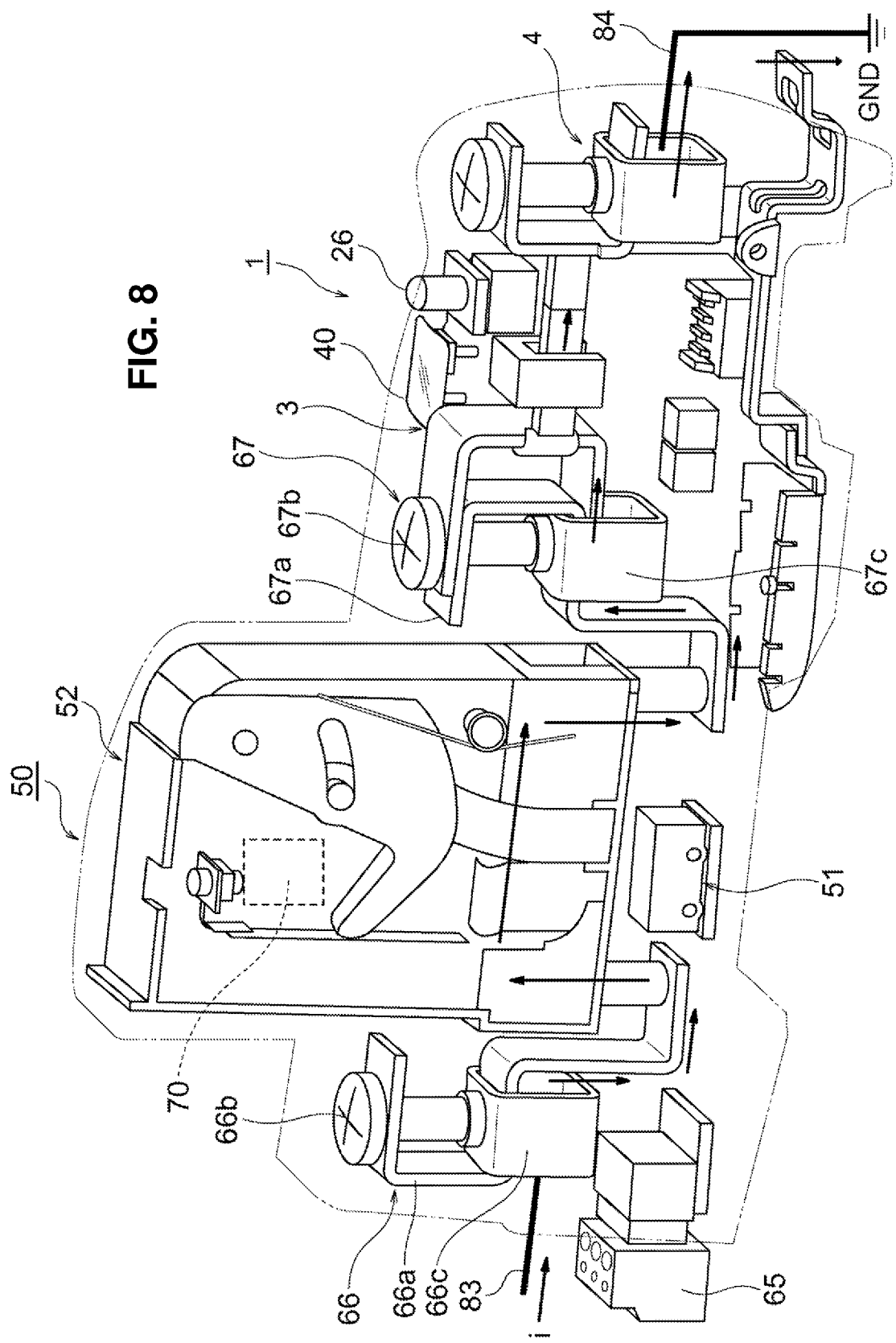

| LIGHTNING SURGE CURRENT i | IMPRESSION OF A PLUS TERMINAL | | IMPRESSION OF A MINUS TERMINAL | |
|---|---|---|---|---|
| | WAVEFORM-MODIFIED VOLTAGE S14 (V) | START-UP VOLTAGE S15 (V) | WAVEFORM-MODIFIED VOLTAGE S14 (V) | START-UP VOLTAGE S15 (V) |
| 100A | 100m | 1.5 | 40m | 1.3 |
| 200A | 330m | 2.0 | 200m | 2.0 |
| 300A | 500m | 2.0 | 460m | 2.0 |
| 400A | 650m | 2.0 | 600m | 2.0 |
| 500A | 800m | 2.0 | 800m | 2.0 |
| 600A | 1.0 | 2.0 | 1.0 | 2.0 |
| 700A | 1.2 | 2.0 | 1.2 | 2.0 |
| 800A | 1.55 | 2.0 | 1.5 | 2.0 |
| 900A | 1.7 | 2.0 | 1.7 | 2.0 |
| 1kA | 1.8 | 2.0 | 1.8 | 2.0 |
| 2kA | 2.6 | 2.0 | 2.6 | 2.0 |

FIG. 10

LIGHTNING SURGE DETECTOR, SURGE PROTECTIVE DEVICE, AND MANAGEMENT SYSTEM FOR SURGE PROTECTIVE DEVICE

BACKGROUND OF THE INVENTION

1. Field of the Invention

The present invention relates to a lightning surge detector adapted to detect a lightning surge current flowing from wire lines of a power line or communications line to a ground wire and display resulting lightning surge information, a surge protective device connected with the lightning surge detector and adapted to protect power supply equipment and other protected equipment from the lightning surge current, and a management system for the surge protective device, the management system being adapted to manage the surge protective device equipped with the lightning surge detector.

2. Description of the Related Art

As described, for example, in Japanese Patent Laid-Open No. 2005-150657 and Japanese Patent Laid-Open No. 2006-059888, surge protective devices according to related art include a lightning protection circuit and a display unit adapted to display a state of deterioration of the lightning protection circuit. When a lightning surge current enters the surge protective device from wire lines of a power line or the like, the lightning surge current is discharged to a ground-wire side by the lightning protection circuit, protecting power supply equipment and other protected equipment connected to the wire lines.

The lightning protection circuit is made up of a lightning protection device such as an arrester or varistor, where the arrester is a lightning protection tube and the varistor is a non-linear resistive element. The lightning protection device will undergo degradation of characteristics when the number of operations increase as a result of lightning surge currents. This may result in burnout due to heat generation. Thus, the display unit adapted to display the state of deterioration of the lightning protection device is provided in the surge protective device.

The display unit of the surge protective device described in Japanese Patent Laid-Open No. 2005-150657 is made up of Thermolabel. The Thermolabel is affixed to the lightning protection device. The Thermolabel changes color with heat generation resulting from operation of the lightning protection device such that changes in the color can be viewed visually.

The display unit of the surge protective device described in Japanese Patent Laid-Open No. 2006-059888 is made up of a coloring member. Furthermore, a disconnect portion is provided to disconnect the lightning protection device from the lightning protection circuit when the lightning protection device deteriorate. When the disconnect portion comes into action, a slide mechanism or swing mechanism causes the coloring member to rotate and thereby change color. Thus, the change in color is configured to be visually viewable through a display window.

However, the conventional surge protective devices described in Japanese Patent Laid-Open No. 2005-150657 and Japanese Patent Laid-Open No. 2006-059888 have problems as described in (1) to (3) below.

(1) Problems with the Surge Protective Device Described in Japanese Patent Laid-Open No. 2005-150657

The Thermolabel of the display unit does not react to low surge currents due to its degree of heat generation. After reaction, the Thermolabel needs replacement because the color of the Thermolabel is irreversible. It is not possible to grasp the number of times lightning surge currents enter. Furthermore, it is not possible to monitor the operations and states of deterioration of plural surge protective devices all together.

(2) Problems with the Surge Protective Device Described in Japanese Patent Laid-Open No. 2006-059888

The display unit is made up of a large number of parts, complicating its structure. Since the large number of display components are housed in the surge protective device, it is difficult to downsize the surge protective device. An attempt to downsize the surge protective device reduces a display area of the display unit, making it difficult to see the display area visually from outside. Furthermore, it is not possible to monitor the operations and states of deterioration of plural surge protective devices all together.

(3) Since the display unit which displays the state of deterioration of the lightning protection device is contained in the surge protective device, even if the display unit is not faulty, if the lightning protection circuit in the surge protective device deteriorates, the surge protective device needs to be discarded and replaced with a new one, resulting in waste. Also, it is not possible to add a discrete display unit to an existing or already-installed surge protective device not pre-installed with a display unit. This is disadvantageous and inconvenient.

SUMMARY OF THE INVENTION

Thus, an object of the present invention is to provide a lightning surge detector, a surge protective device, and a management system for the surge protective device which have solved the above-described problems with the conventional techniques.

That is, a first object of the present invention is to provide a lightning surge detector which is simple in structure, easy to downsize, and furthermore capable of detecting even small impulsive lightning surge currents with high accuracy.

A second object of the present invention is to provide a small-size surge protective device equipped with a lightning surge detector, the surge protective device having a small size and allowing summary information about lightning surge currents and the like to be viewed visually.

A third object of the present invention is to provide a small-size management system for the surge protective device equipped with the lightning surge detector, the management system allowing detailed information about the surge protective device equipped with the lightning surge detector to be viewed and managed on a monitor unit.

To achieve the first object, a first aspect of the present invention provides a lightning surge detector comprising: a first terminal unit connected to a ground-side terminal unit of a surge protective device; a second terminal unit connected with a ground wire; a conducting coupling bar adapted to couple the first terminal unit and the second terminal unit; a detection coil placed in a vicinity of the conducting coupling bar and adapted to output an induction current induced by a lightning surge current flowing through the conducting coupling bar; a waveform processing unit adapted to convert the induction current into a voltage, thereby generating a detection voltage, perform a stretching process on a voltage waveform of the detection voltage along a time axis, and thereby output a waveform-modified voltage; a computation control unit adapted to accept input of the waveform-modified voltage, calculate a current value of the lightning surge current from a voltage value of the waveform-modified voltage, and produce a lightning surge current calculation result; and a display unit adapted to display the lightning surge current calculation result so as to be viewable from outside under the control of the computation control unit, wherein the first terminal unit, the second terminal unit, the conducting coupling bar, the detection coil, the waveform processing unit, the computation control unit, and the display unit are unitized by being housed in a casing.

To achieve the second object, a second aspect of the present invention provides a surge protective device detachably outfitted with the lightning surge detector according to the first aspect, the surge protective device comprising: a line-side terminal unit connected with a power line or communications line; a ground-side terminal unit on which the first terminal unit of the lightning surge detector is detachably mounted; and a lightning protection circuit connected between the line-side terminal unit and the ground-side terminal unit and adapted to discharge the lightning surge current entering through the line-side terminal unit to the ground-side terminal unit.

To achieve the third object, a third aspect of the present invention provides a management system for a surge protective device comprising: the surge protective device according to the second aspect detachably outfitted with the lightning surge detector according to the first aspect; and a monitor unit disposed next to the surge protective device and adapted to manage operating condition and operation history of the lightning surge detector outfitted on the surge protective device. The monitor unit comprises a current transformer adapted to detect the lightning surge current outputted from the second terminal unit of the lightning surge detector, a communications unit adapted to acquire the operating condition and the operation history of the lightning surge detector via communications and output the acquired operating condition and operation history to the outside via communications, a storage unit adapted to store the acquired operating condition and operation history, and a display unit adapted to display the acquired operating condition and operation history, where the current transformer, the communications unit, the storage unit, and the display unit are unitized by being housed in a casing.

With the lightning surge detector according to the first aspect, since the detection coil is placed in the vicinity of the conducting coupling bar, a portion for detecting lightning surge currents can be downsized. Moreover, the lightning surge detector, which is made up of a small number of parts, has a simple structure and readily allows its overall shape to be downsized. Furthermore, since the lightning surge detector detects the lightning surge current flowing through the conducting coupling bar using the detection coil, stretches the voltage waveform of the detection voltage along the time axis using the waveform processing unit, and subsequently calculates the current value of the lightning surge current using the computation control unit, even small impulsive lightning surge currents can be detected with high accuracy.

With the surge protective device according to the second aspect, since the lightning surge detector can be joined to the surge protective device by connecting the first terminal unit of the lightning surge detector to the ground-side terminal unit of the surge protective device, the surge protective device equipped with the lightning surge detector can be made small in size. Furthermore, with the surge protective device equipped with the lightning surge detector, since summary information about the lightning surge current and the like flowing through the surge protective device is displayed on the display unit of the lightning surge detector, the summary information can be viewed visually.

Regarding the management system for a surge protective device according to the third aspect, since the management system for a surge protective device is made up of the surge protective device equipped with the lightning surge detector, and the monitor unit placed in the vicinity of the surge protective device, the management system for the surge protective device can be made small in size. Moreover, detailed information about the surge protective device equipped with the lightning surge detector can be viewed and managed on the monitor unit.

The above and other objects and novel features of the invention will become more apparent from the following description of the preferred embodiments taken in conjunction with the accompanying drawings. However, the following drawings are provided for illustrative purposes only and are not intended to limit the scope of the present invention.

BRIEF DESCRIPTION OF THE DRAWINGS

FIG. 8 is a schematic see-through perspective view showing an internal structure of FIG. 7;

FIG. 10 is a diagram showing correlation values between lightning surge currents flowing through a conducting coupling bar 5 of FIG. 4 and voltage values of a waveform-modified voltage S14 outputted from a waveform processing unit 10;

DETAILED DESCRIPTION OF THE PREFERRED EMBODIMENTS

Embodiments of the present invention will be described below with reference to the drawings.

First Embodiment

Configuration of Lightning Surge Detector According to First Embodiment

Figure 1:
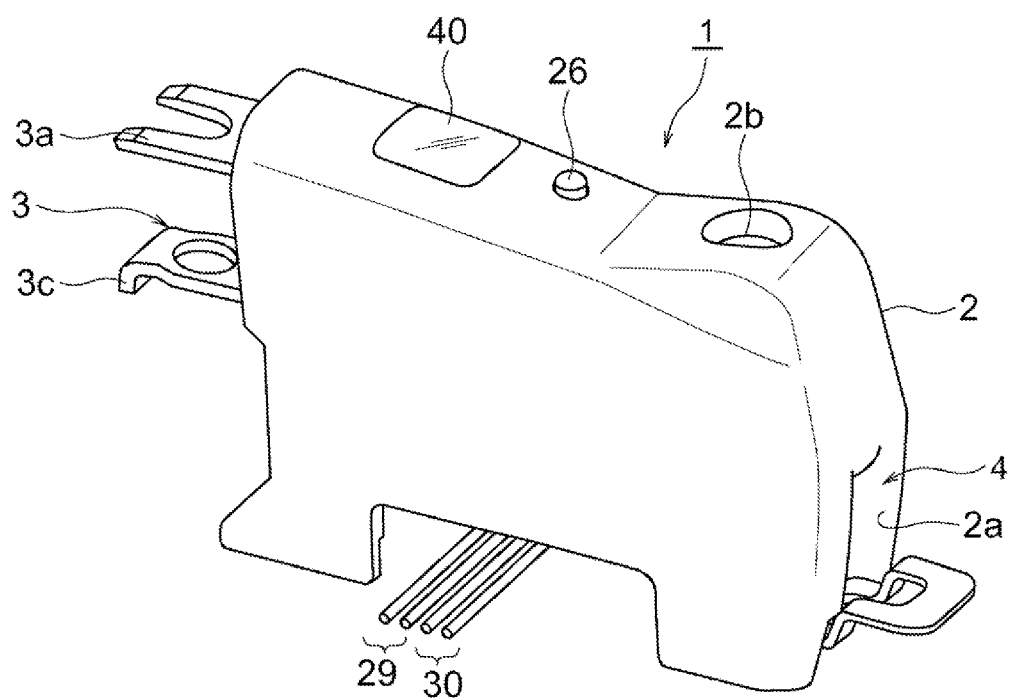
FIG. 1 is a schematic perspective view showing an exemplary structure of a lightning surge detector according to a first embodiment of the present invention.

FIG. 1 is a schematic perspective view showing an exemplary structure of a lightning surge detector according to a first embodiment of the present invention. Furthermore, FIG. 2 is a schematic see-through perspective view showing an internal structure of FIG. 1.

Figure 2:
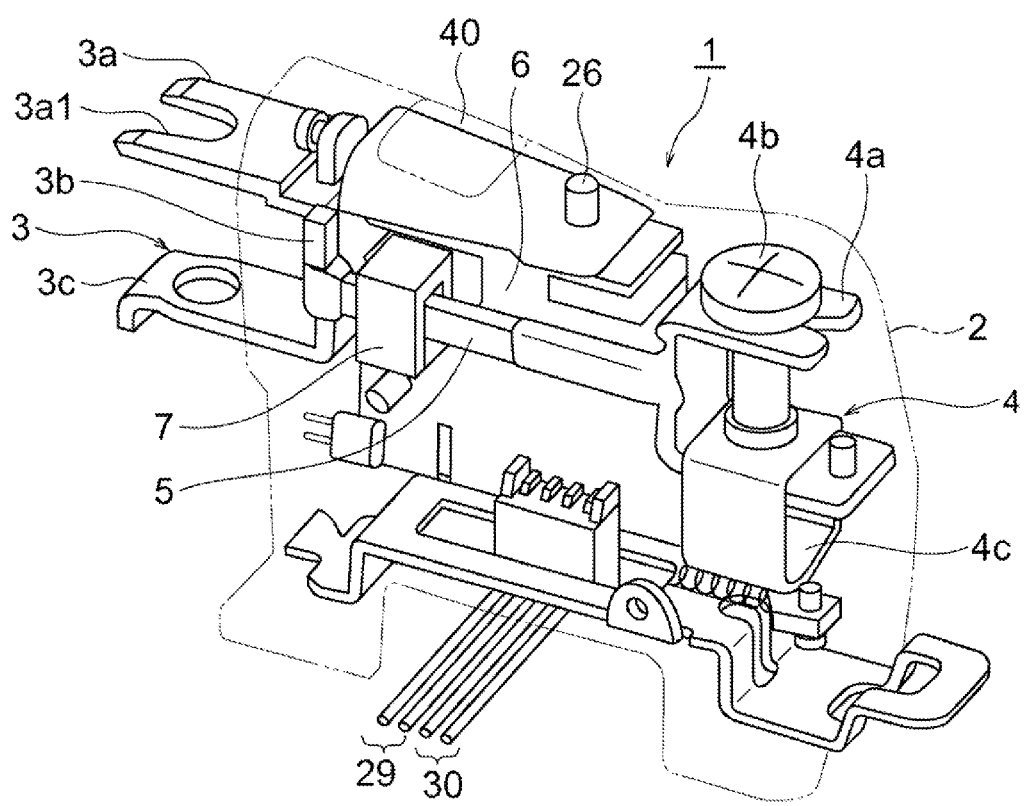
FIG. 2 is a schematic see-through perspective view showing an internal structure of FIG. 1.

As shown in FIGS. 1 and 2, the lightning surge detector 1 has a substantially box-shaped casing 2. A first terminal unit 3 made of metal, shaped to contact at two points, and substantially U-shaped in cross section is mounted on a flank of the casing 2. The first terminal unit 3 includes two lugs 3a and 3c facing each other and a coupling strip 3b adapted to couple the two lugs 3a and 3c. The coupling strip 3b is fixed in the casing 2 while the lugs 3a and 3c protrude outward from the casing 2. An insertion groove 3a1 adapted to allow insertion of a screw is formed at a tip of one lug 3a.

A ground wire entry port 2a is formed in a flank on the opposite side of the casing 2 from the first terminal unit 3. In the vicinity of the port 2a, a screw hole 2b is formed on the top face of the casing 2. In the casing 2, a second terminal unit 4 made of metal and used to insert and fasten the ground wire is mounted at a location facing the port 2a and screw hole 2b. The second terminal unit 4 is made up of a support frame 4a substantially U-shaped in cross section, a screw 4b inserted in a vertical direction through the screw hole 2b, and a fixed frame 4c substantially rectangular in cross section. The support frame 4a is fixed in the casing 2, being made up of a first strip and second strip facing each other and a bottom strip adapted to couple the first strip and second strip, where the bottom strip is placed in a vertical direction while the first strip and second strip are placed in a horizontal direction. The first strip of the support frame 4a is located directly below the screw hole 2b and penetrated by the screw 4b. The fixed frame 4c is attached to a lower end of the screw 4b in such a way as to be movable in an up and down direction. A terminal portion of the ground wire is inserted through the port 2a into the fixed frame 4c. When the screw 4b is tightened, the fixed frame 4c moves up and down, causing the terminal portion of the ground wire to be fixed to the second terminal unit 4.

The first terminal unit 3 and second terminal unit 4 are coupled together by a conducting coupling bar 5 made of metal and placed in a substantially horizontal direction. A printed wiring board 6 adapted to mount electronic circuit components and the like thereon is fixed in the vicinity of the conducting coupling bar 5, where the electronic circuit components and the like make up control means. The printed wiring board 6 is connected with a detection coil 7. The detection coil 7 is placed in the vicinity of the conducting coupling bar 5 and adapted to output an induction current induced by a lightning surge current flowing through the conducting coupling bar 5, in order to detect the lightning surge current.

A view button 26 and display unit 40 are provided on the top face of the casing 2. The display unit 40 is adapted to display results of detecting lightning surge currents flowing through the conducting coupling bar 5, the number of times of detection, and the like in such a way as to be viewable from outside and is made up of plural display elements such as light-emitting diodes (hereinafter referred to as "LEDs"). The view button 26 is a switch used to display the results of detecting lightning surge currents, number of times of detection, and the like, which are stored, on the display unit 40.

The printed wiring board 6 is connected with a two-wire communications line 29 and a two-wire power line 30 via connectors (not shown).

Figure 3A:
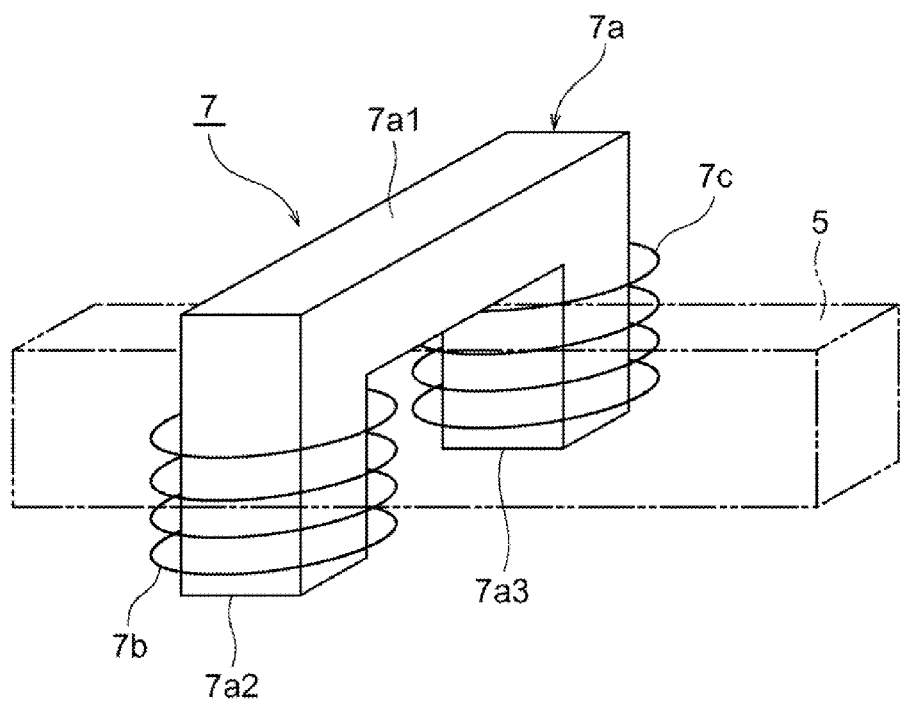
FIG. 3A is an enlarged perspective view showing a detection coil 7 of FIG. 2.

FIG. 3A is an enlarged perspective view showing the detection coil 7 of FIG. 2.

As shown in FIG. 3A, the detection coil 7 is made up of a core 7a substantially U-shaped in cross section and used to embrace the conducting coupling bar 5 via an insulating member (not shown) and a pair of a first winding 7b and second winding 7c wound around core 7a in such a way as to be symmetrical to each other with respect to the conducting coupling bar 5.

The core 7a substantially U-shaped in cross section is made up of base 7a1 located on a bottom side, and a first leg 7a2 and second leg 7a3 located on opposite lateral sides. The first leg 7a2 and second leg 7a3 are wound with the pair of the first winding 7b and second winding 7c, respectively. The pair of the first winding 7b and second winding 7c are wound around the core 7a in such a way as to be symmetrical to each other with respect to the coupling bar 5.

FIGS. 3B, 3C, 3D, 3E, 3F, 3G, 3H, and 3I are schematic circuit diagrams showing connection conditions of the detection coil 7 of FIG. 3A.

As shown in FIGS. 3B to 3I, the detection coil 7 has a wide range of possible variations resulting from combinations of winding directions and connection conditions of the first winding 7b and second winding 7c of the detection coil 7. However, in order to solve the problems with the conventional techniques described above, the detection coil 7 needs to be configured as shown in FIGS. 3B and 3C or FIGS. 3F and 3G rather than FIGS. 3D and 3E or FIGS. 3H and 3I. This will be described in detail below.

Figure 3B:
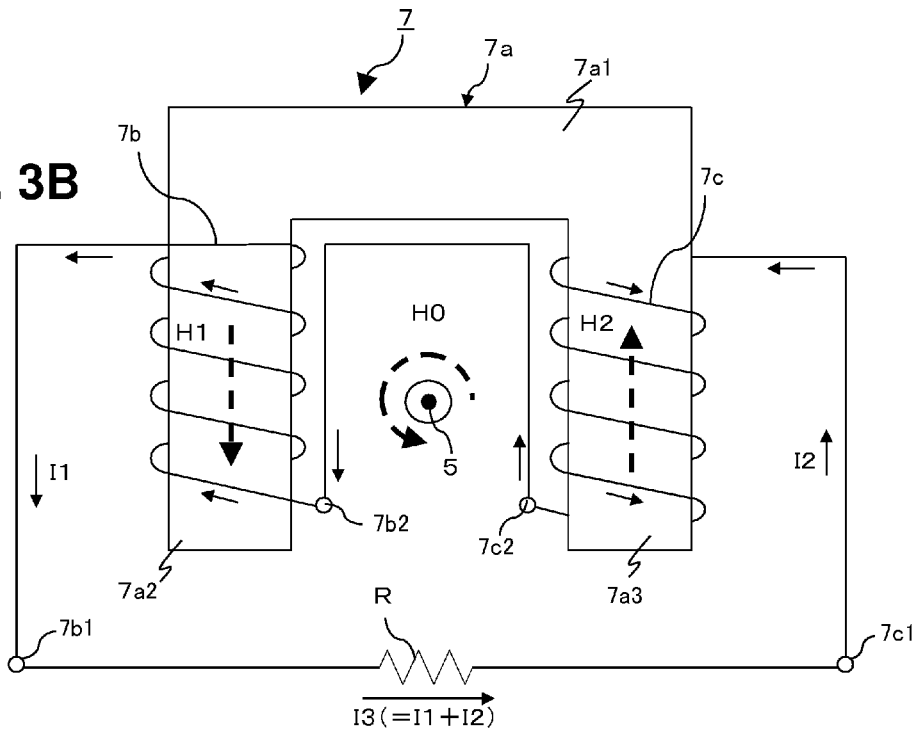
FIGS. 3B to 3I are schematic circuit diagrams showing connection conditions of the detection coil 7 of FIG. 3A.

As shown in FIG. 3B, the detection coil 7 is made up of the core 7a, first winding 7b, and second winding 7c and arranged in such a way as to embrace the conducting coupling bar 5. Of the first leg 7a2 and second leg 7a3 of the core 7a, the first leg 7a2 is wound with the first winding 7b, and the second leg 7a3 is wound with the second winding 7c. In the detection coil 7, the first winding 7b and second winding 7c are wound in a predetermined direction and connected in series under a predetermined connection condition such that no induction current will flow when an external magnetic field is applied, and that an induction current will be outputted when a lightning surge current flows through the conducting coupling bar 5. That is, at a first end 7b1 and second end 7b2 of the first winding 7b as well as at a first end 7c1 and second end 7c2 of the second winding 7c, the first end 7b1 of the first winding 7b and the first end 7c1 of the second winding 7c are open. The second end 7b2 of the first winding 7b is connected to the second end 7c2 of the second winding 7c.

The detection coil 7 is configured such that when a lightning surge current flows through the conducting coupling bar 5 placed so as to be passed into a region embraced by the core 7a and consequently a magnetic field H0 is generated in the direction of a broken line arrow in FIG. 3B, magnetic fields H1 and H2 will be induced in the first winding 7b and second winding 7c, respectively, in opposite directions as indicated by broken line arrows, generating induction currents I1 and I2, respectively, in the same direction as indicated by arrows. Consequently, when a load R is connected between the first end 7b1 of the first winding 7b and the first end 7c1 of the second winding 7c, a resultant induction current I3 (=I1+I2) flows through the load R.

Figure 3C:
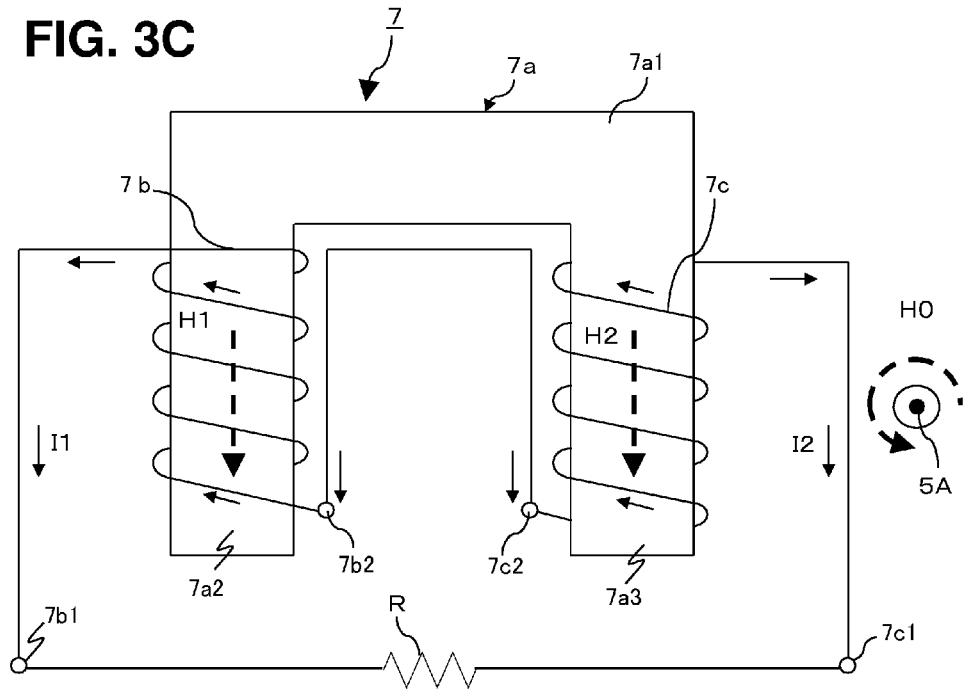

FIG. 3C shows an effect produced when a lightning surge current does not flow through the conducting coupling bar 5 shown in FIG. 3B, but flows through a conducting coupling bar 5A in an adjacent lightning surge detector (not shown).

The conducting coupling bar 5A is placed, for example, in a region which, being parallel to the first winding 7b and second winding 7c, is not embraced by the core 7a. Let us consider a situation in which a lightning surge current flows through the conducting coupling bar 5A and consequently an external magnetic field H0 is generated in the direction of a broken line arrow in FIG. 3C. When an external magnetic field H0 such as described above is generated, magnetic fields H1 and H2 will be induced in the first winding 7b and second winding 7c, respectively, in the same direction as indicated by broken line arrows, generating induction currents I1 and I2, respectively, in opposite directions as indicated by arrows. Since the two induction currents I1 and I2 flow in opposite directions, cancelling out each other, no induction current flows through the load R. In this way, with the detection coil 7 of FIG. 3B, even if an external magnetic field H0 is applied by the adjacent coupling bar 5A as shown in FIG. 3C, no induction current flows between the first end 7b1 of the first winding 7b and first end 7c1 of the second winding 7c. Therefore, the detection coil 7 according to this first embodiment uses a connection configuration such as shown in FIG. 3B.

Figure 3D:
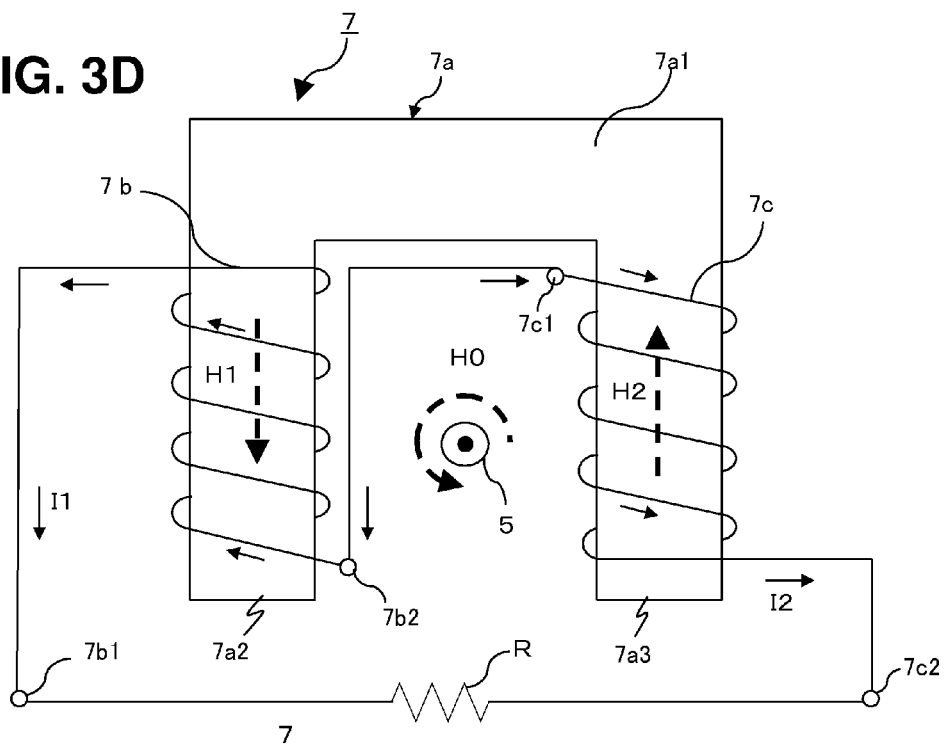

FIG. 3D shows a connection condition under which no induction current flows between the first end 7b1 of the first winding 7b and second end 7c2 of the second winding 7c even if a lightning surge current flows through the conducting coupling bar 5.

In the detection coil 7 shown in FIG. 3D, the first end 7b1 of the first winding 7b and second end 7c2 of the second winding 7c are open while the second end 7b2 of the first winding 7b and first end 7c1 of the second winding 7c are connected. When a lightning surge current flows through the conducting coupling bar 5, generating a magnetic field H0 in the direction of a broken line arrow in FIG. 3D, magnetic fields H1 and H2 are induced in the first winding 7b and second winding 7c, respectively, in opposite directions as indicated by broken line arrows, generating induction currents I1 and I2, respectively, in opposite directions as indicated by arrows. Since the induction currents I1 and I2 flowing in opposite directions are cancelled out, no induction current flows through the load R.

Figure 3E:
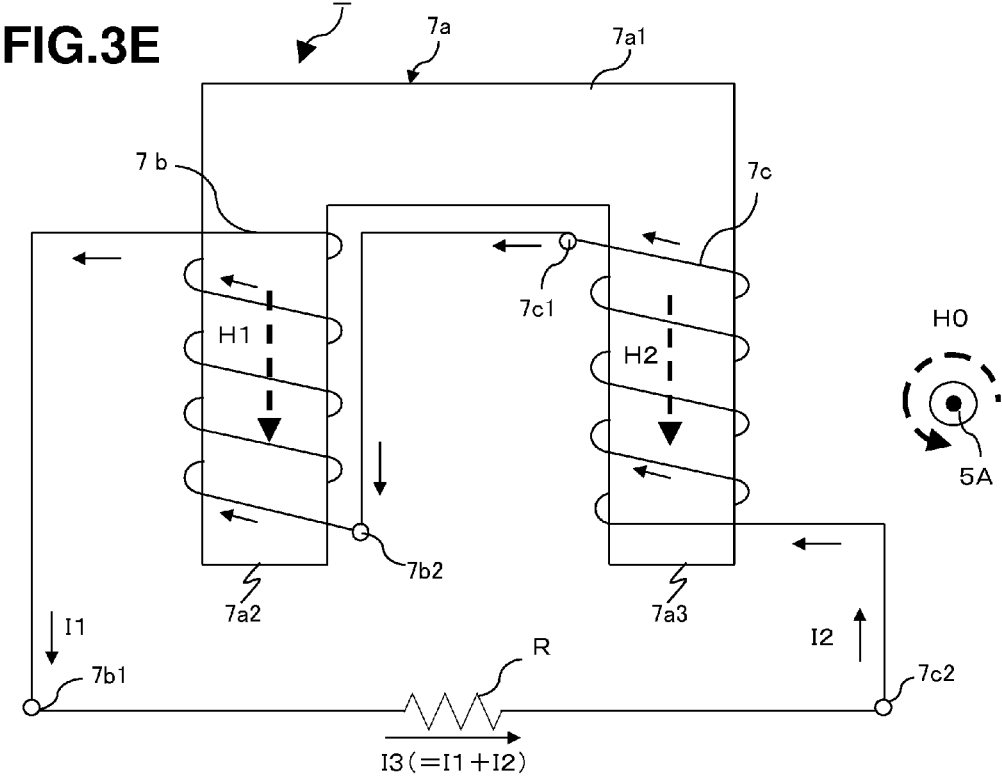

FIG. 3E shows an effect produced when a lightning surge current does not flow through the conducting coupling bar 5 shown in FIG. 3D, but flows through a conducting coupling bar 5A in an adjacent lightning surge detector (not shown).

Let us consider a situation in which a lightning surge current flows through the conducting coupling bar 5A and consequently an external magnetic field H0 is generated in the direction of a broken line arrow in FIG. 3E. When a external magnetic field H0 such as described above is generated, magnetic fields H1 and H2 will be induced in the first winding 7b and second winding 7c, respectively, in the same direction as indicated by broken line arrows, generating induction currents I1 and I2, respectively, in the same direction as indicated by arrows. Since the two induction currents I1 and I2 are combined, a resultant induction current I3 (=I1+I2) flows through the load R. Therefore, the detection coil 7 according to this first embodiment does not use a connection configuration such as shown in FIG. 3D.

Figure 3F:
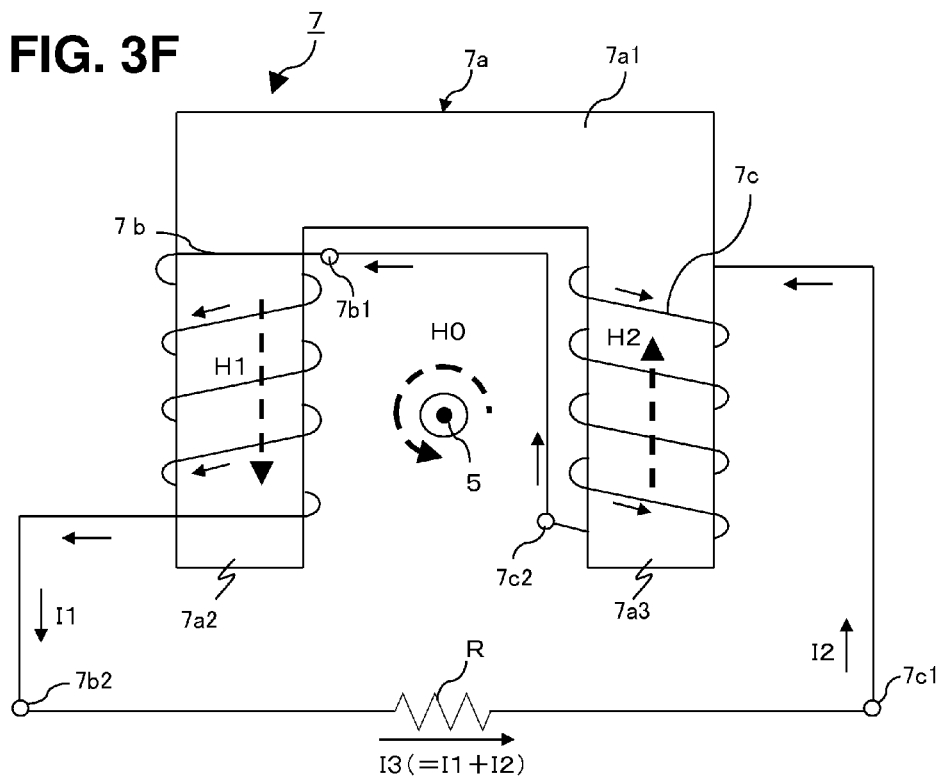

FIG. 3F shows a connection condition under which an induction current flows between the second end 7b2 of the first winding 7b and first end 7c1 of the second winding 7c when a lightning surge current flows through the conducting coupling bar 5.

In the detection coil 7 shown in FIG. 3F, the second end 7b2 of the first winding 7b and first end 7c1 of the second winding 7c are open while the first end 7b1 of the first winding 7b and second end 7c2 of the second winding 7c are connected. When a lightning surge current flows through the conducting coupling bar 5, generating a magnetic field H0 in the direction of a broken line arrow in FIG. 3F, magnetic fields H1 and H2 are induced in the first winding 7b and second winding 7c, respectively, in opposite directions as indicated by broken line arrows, generating induction currents I1 and I2, respectively, in the same direction as indicated by arrows. Consequently, the two induction currents I1 and I2 are combined, and the resultant induction current I3 (=I1+I2) flows through the load R.

Figure 3G:
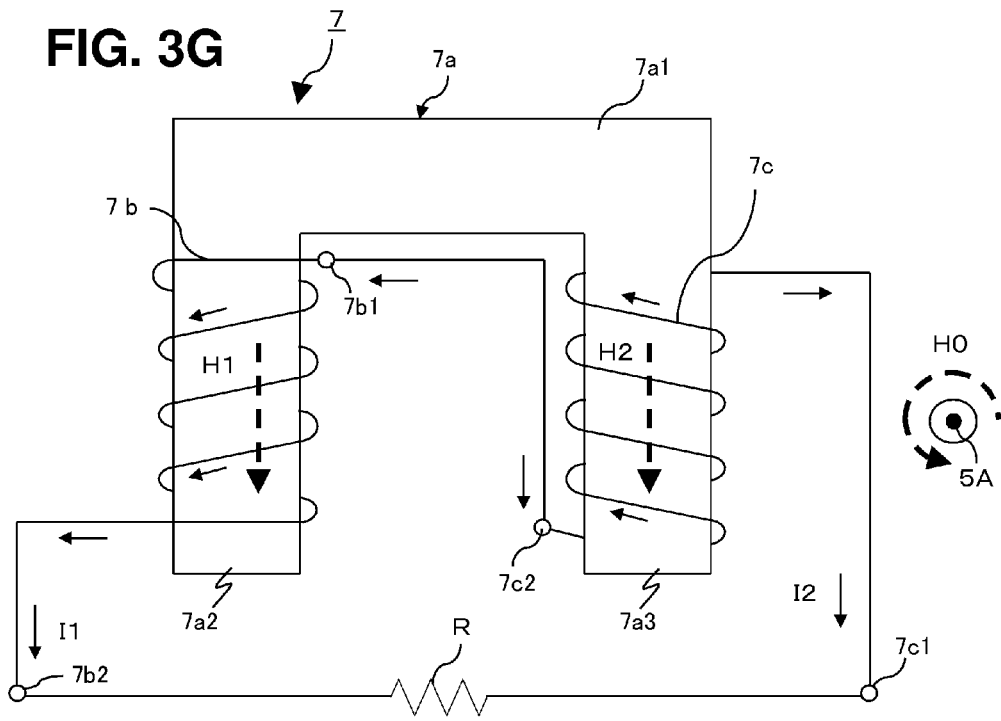

FIG. 3G shows an effect produced when a lightning surge current does not flow through the conducting coupling bar 5 shown in FIG. 3F, but flows through a conducting coupling bar 5A in an adjacent lightning surge detector (not shown).

When a lightning surge current flows through the conducting coupling bar 5A, generating an external magnetic field H0 in the direction of a broken line arrow in FIG. 3G, magnetic fields H1 and H2 will be induced in the first winding 7b and second winding 7c, respectively, in the same direction as indicated by broken line arrows, generating induction currents I1 and I2, respectively, in opposite directions as indicated by arrows. Since the induction currents I1 and I2 are cancelled out, no induction current flows through the load R. Therefore, the detection coil 7 according to this first embodiment uses a connection configuration such as shown in FIG. 3F.

Figure 3H:
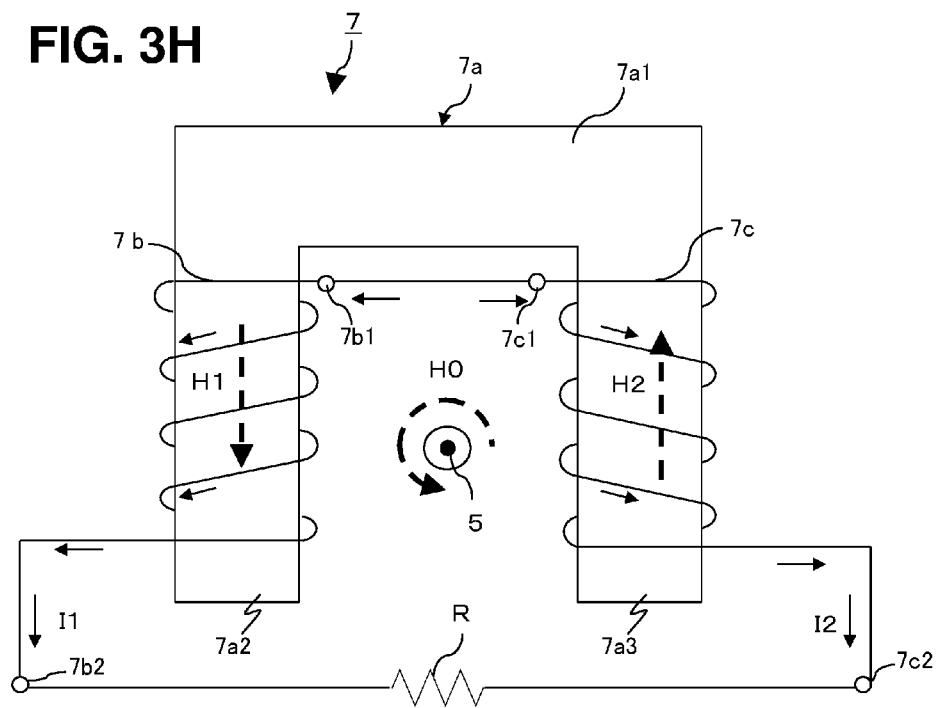

FIG. 3H shows a connection condition under which no induction current flows between the second end 7b2 of the first winding 7b and second end 7c2 of the second winding 7c even if a lightning surge current flows through the conducting coupling bar 5.

In the detection coil 7 shown in FIG. 3H, the second end 7b2 of the first winding 7b and second end 7c2 of the second winding 7c are open while the first end 7b1 of the first winding 7b and the first end 7c1 of the second winding 7c are connected. When a lightning surge current flows through the conducting coupling bar 5, generating a magnetic field H0 in the direction of a broken line arrow in FIG. 3H, magnetic fields H1 and H2 are induced in the first winding 7b and second winding 7c, respectively, in opposite directions as indicated by broken line arrows, generating induction currents I1 and I2, respectively, in opposite directions as indicated by arrows. Since the induction currents I1 and I2 flowing in opposite directions are cancelled out, no induction current flows through the load R.

Figure 3I:
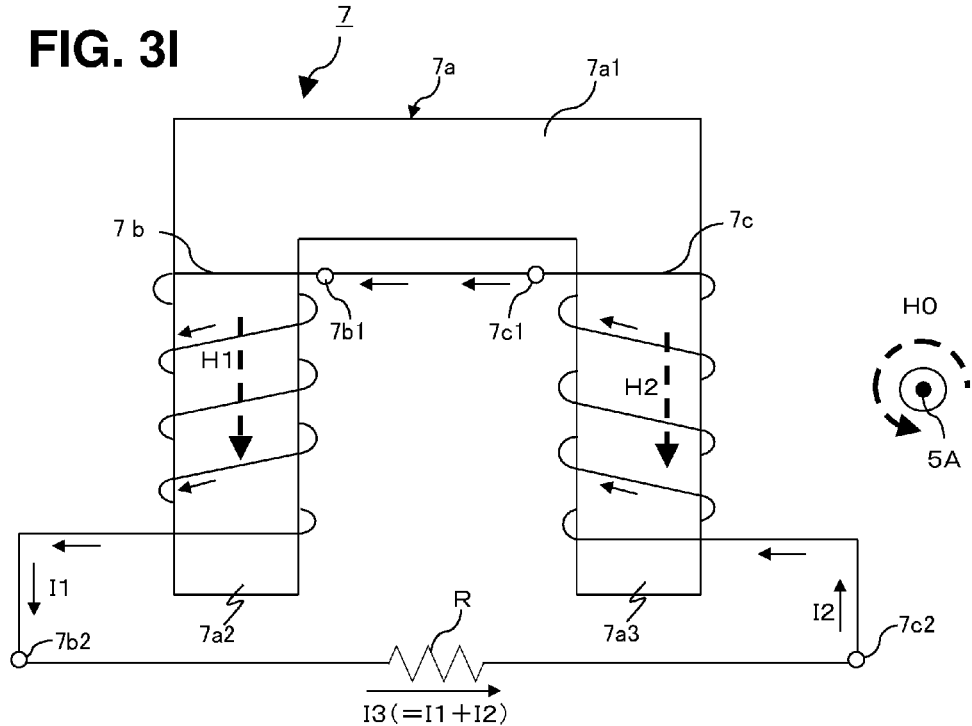

FIG. 3I shows an effect produced when a lightning surge current does not flow through the conducting coupling bar 5 shown in FIG. 3H, but flows through a conducting coupling bar 5A in an adjacent lightning surge detector (not shown).

When a lightning surge current flows through the conducting coupling bar 5A, generating an external magnetic field H0 in the direction of a broken line arrow in FIG. 3I, magnetic fields H1 and H2 will be induced in the first winding 7b and second winding 7c, respectively, in the same direction as indicated by broken line arrows, generating induction currents I1 and I2, respectively, in the same direction as indicated by arrows. Consequently, since the two induction currents I1 and I2 are combined, a resultant induction current I3 (=I1+I2) flows through the load R. Therefore, the detection coil 7 according to this first embodiment does not use a connection configuration such as shown in FIG. 3H.

Figure 4:
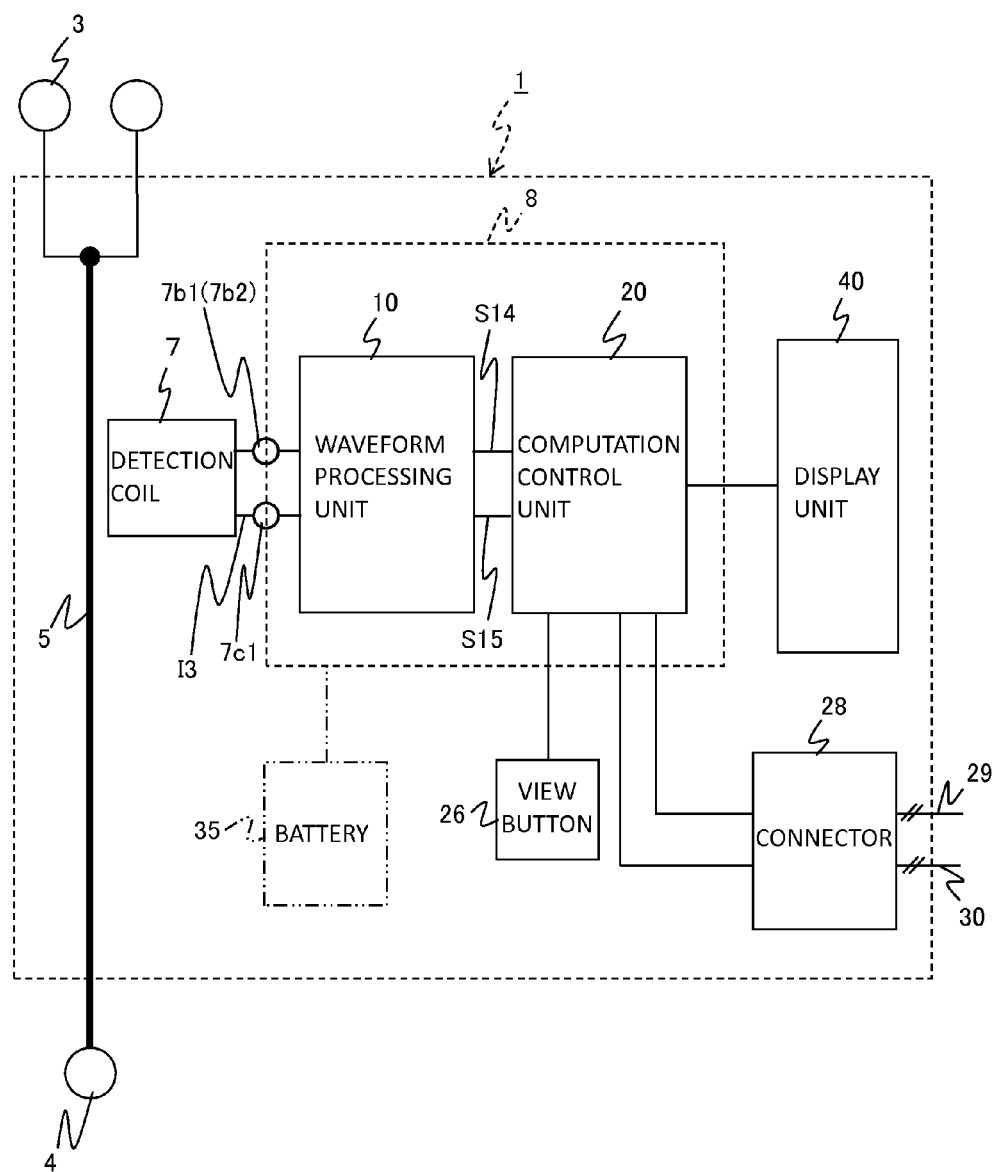
FIG. 4 is a schematic configuration diagram showing an electric circuit of the lightning surge detector 1 shown in FIGS. 1, 2, 3A, 3B, and 3F.

FIG. 4 is a schematic configuration diagram showing an electric circuit of the lightning surge detector 1 shown in FIGS. 1, 2, 3A, 3B, and 3F.

As shown in FIG. 4, the detection coil 7 is placed in the vicinity of the conducting coupling bar 5 which couples the first terminal unit 3 and second terminal unit 4 together. The first end 7b1 or second end 7b2 and first end 7c1 in the detection coil 7 are connected to control means 8 mounted on the printed wiring board 6 of FIG. 2. The control means 8 is adapted to control overall operation of the lightning surge detector 1 and equipped, for example, with a waveform processing unit 10 and computation control unit 20.

The waveform processing unit 10 is a circuit adapted to convert the induction current I3 outputted from the detection coil 7 into a voltage, thereby generating a detection voltage, perform a stretching process on a voltage waveform of the detection voltage along a time axis and output a waveform-modified voltage S14, and generate and output a start-up voltage S15 from the detection voltage. An output side of the waveform processing unit 10 is connected to the computation control unit 20. The computation control unit 20 is a circuit adapted to accept inputs of waveform-modified voltage S14 and start-up voltage S15, get started by the start-up voltage S15, and then calculate a current value of the lightning surge current from a voltage value of the waveform-modified voltage S14 and thereby produce a lightning surge current calculation result. An output side of the computation control unit 20 is connected to the display unit 40. The computation control unit 20 is also connected with the view button 26 and a connector 28.

The lightning surge detector 1 operates by being supplied externally with electric power via the power line 30 and connector 28. However, if the lightning surge detector 1 is to be configured with a self-contained power supply without an external power supply, a battery 35 may be provided internally for electric power supply.

Figure 5:
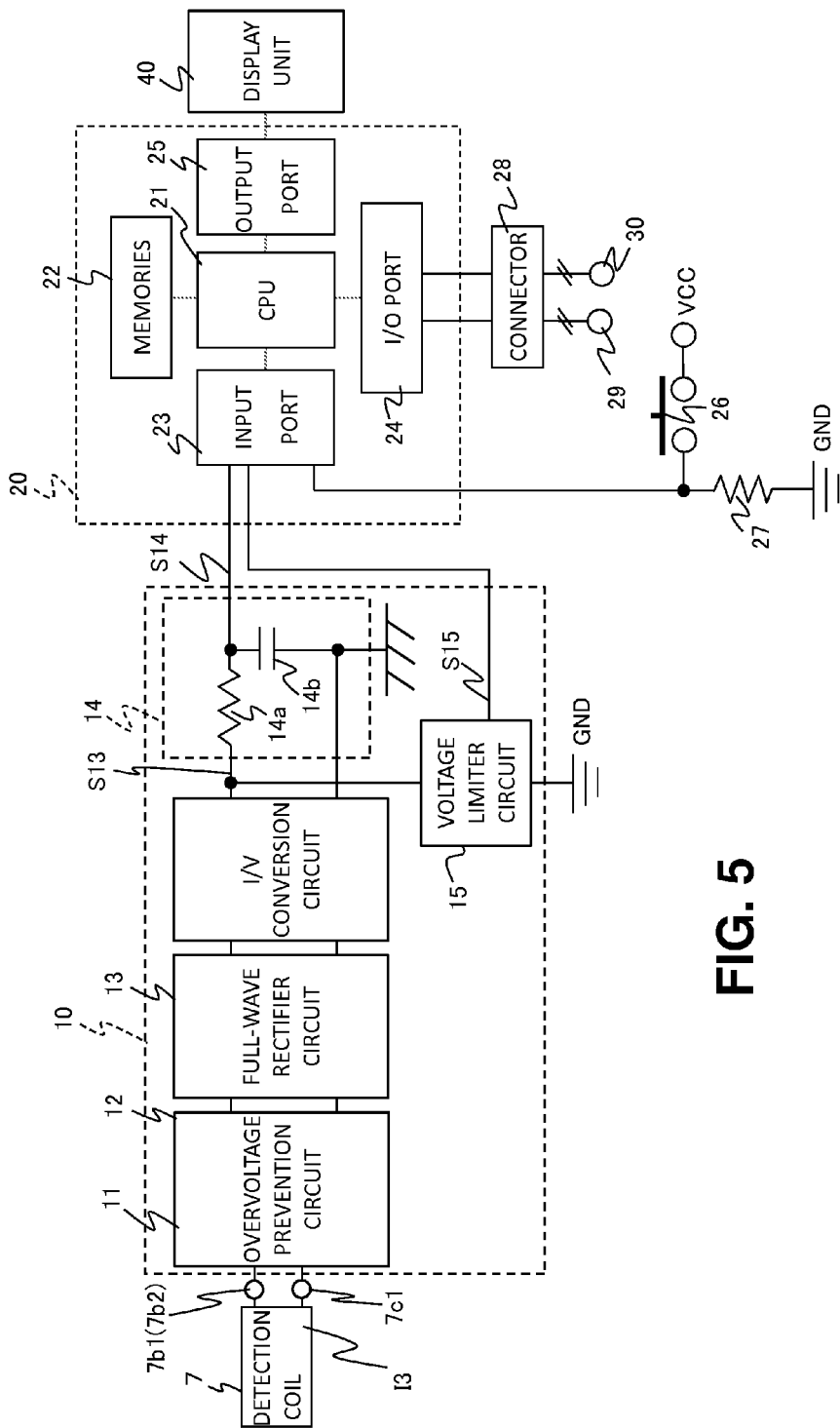
FIG. 5 is a schematic circuit diagram showing an exemplary circuit configuration of FIG. 4.

FIG. 5 is a schematic circuit diagram showing an exemplary circuit configuration of FIG. 4.

As shown in FIG. 5, the waveform processing unit 10 includes an overvoltage prevention circuit 11, a full-wave rectifier circuit 12, a current/voltage conversion circuit (hereinafter referred to as an "I/V conversion circuit") 13, a time constant circuit 14, a voltage limiter circuit 15, and the like.

The overvoltage prevention circuit 11 is adapted to keep a maximum voltage value between the first end 7b1 or second end 7b2 and first end 7c1 in the detection coil 7 at or below a fixed value (e.g., 30 V or below) and is made up of, for example, two Zener-diodes connected in series but in opposite directions between the first end 7b1 or second end 7b2 and first end 7c1 in the detection coil 7. An output side of the overvoltage prevention circuit 11 is connected to the full-wave rectifier circuit 12. The full-wave rectifier circuit 12 is adapted to convert the induction current I3 induced in the detection coil 7 into a direct current and is made up of, for example, four bridge-connected rectifier diodes. An output side of the full-wave rectifier circuit 12 is connected to the I/V conversion circuit 13.

The I/V conversion circuit 13 is adapted to convert an output current of the full-wave rectifier circuit 12 into a voltage, thereby generating a detection voltage S13 and is made up of, for example, resistors connected in parallel between two output terminals of the full-wave rectifier circuit 12. An output side of the I/V conversion circuit 13 is connected with the time constant circuit 14 and voltage limiter circuit 15 which are parallel to each other. The time constant circuit 14 is adapted to perform a stretching process on the voltage waveform of the detection voltage S13 generated by the I/V conversion circuit 13 along a time axis and output the waveform-modified voltage S14 in analog form and is made up of, for example, a series circuit of a resistor 14a and capacitor 14b with a large time constant. The voltage limiter circuit 15 is adapted to limit the detection voltage S13 to or below a fixed voltage value by stepping it down with the help of a resistor (not shown) which steps down the detection voltage S13, and thereby generate the start-up voltage S15 and is made up of, for example, LEDs, diodes, resistors, and the like. An output side of the time constant circuit 14 and voltage limiter circuit 15 is connected with the computation control unit 20.

The computation control unit 20 is started (woken up) by the start-up voltage S15, provided with a computation function, control function, and the like, and made up of a microcontroller (e.g., peripheral interface controller: hereinafter referred to as "PIC"), where the computation function involves converting the inputted waveform-modified voltage S14 in analog form into a digital signal, calculating the current value of the lightning surge current from the voltage value of the digital signal, and thereby producing a lightning surge current calculation result. The PIC is used to control connection of peripheral devices of a computer. The PIC is made up of a single chip containing a central processing unit (hereinafter referred to as a "CPU") 21 which has a computation function and control function, memories 22, such as a read only memory (hereinafter referred to as a "ROM") and random access memory (hereinafter referred to as a "RAM"), accessed by the CPU 21, and an input port 23, an input/output (hereinafter referred to as an "I/O") port 24, an output port 25, and the like controlled by the CPU 21. The PIC is designed to be controlled by programs written into the memories 22.

The input port 23 of the computation control unit 20 has functions to accept input of the start-up voltage S15 outputted from the voltage limiter circuit 15 and thereby wake up the CPU 21 from a sleep state, accept input of the waveform-modified voltage S14 outputted in analog form from the time constant circuit 14 and perform analog/digital conversion (hereinafter referred to as "A/D conversion"), thereby converting the waveform-modified voltage S14 into a digital signal, and accept input of an output signal and the like from the view button 26.

The view button 26 connected to the input port 23 is a normally-off switch connected between the input port 23 and a power terminal on the side of a supply voltage VCC. That electrode of the view button 26 which is located on the side of the input port 23 is connected to a ground terminal on the side of ground GND via a resistor 27. The I/O port 24 is connected with the two-wire communications line 29 and two-wire power line 30 via the connector 28. The CPU 21 and I/O port 24 have a communications function of communicating with the outside via the connector 28 and communications line 29, a function of receiving electric power from the outside via the connector 28 and power line 30, and other functions. The output port 25 has a digital/analog conversion (hereinafter referred to as "D/A conversion") function of converting the lightning surge current calculation result and the like which are digital signals outputted from the CPU 21 into analog signals, giving the analog signals to the display unit 40. The display unit 40 has a function of lighting up to display the post-conversion analog signals of the lightning surge current calculation result and the like.

Configuration of Surge Protective Device According to First Embodiment

Figure 6:
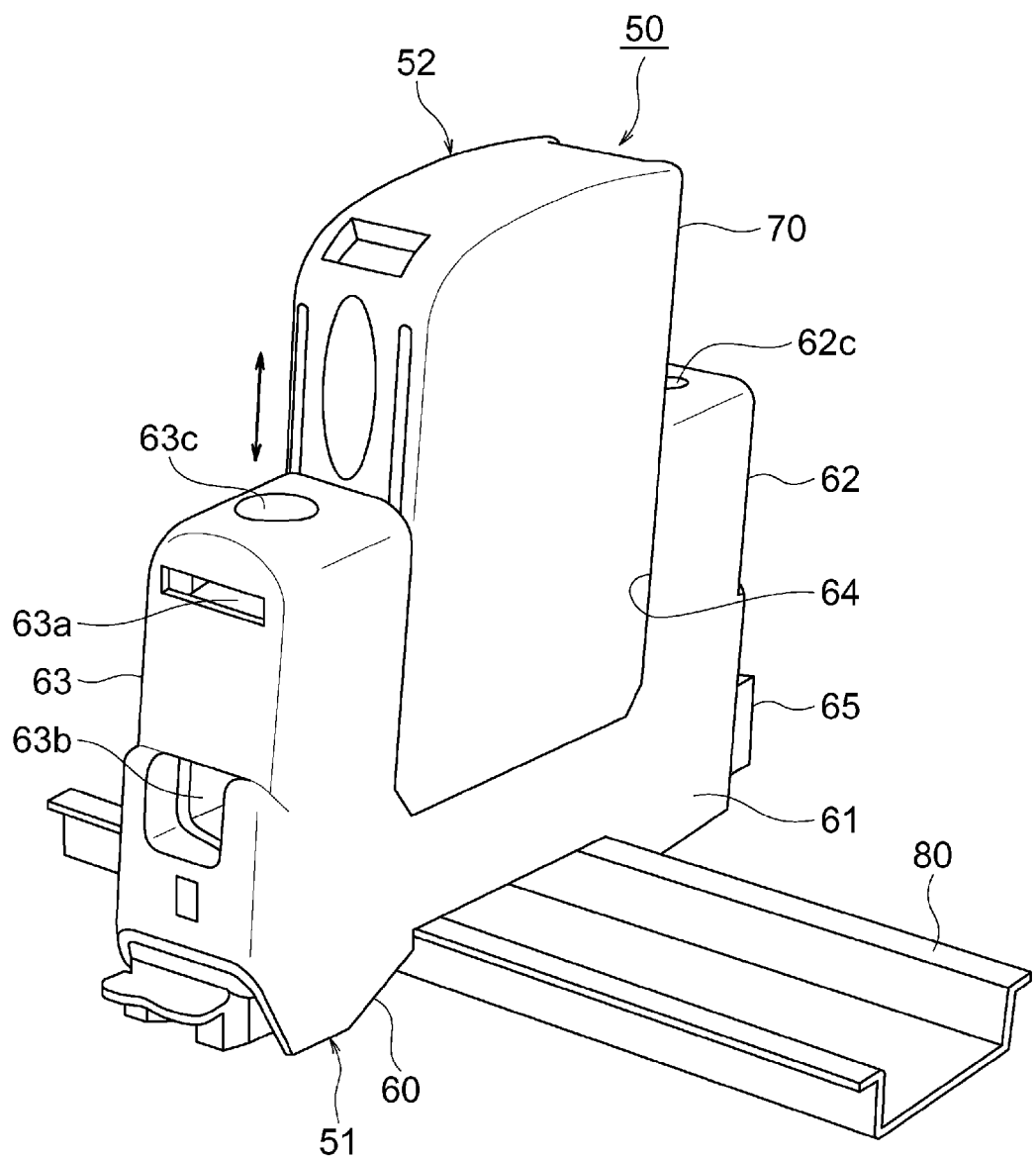
FIG. 6 is a schematic perspective view showing an exemplary structure of a surge protective device according to the first embodiment of the present invention.

FIG. 6 is a schematic perspective view showing an exemplary structure of a surge protective device according to the first embodiment of the present invention.

As shown in FIG. 6, the surge protective device 50 is outfitted with the lightning surge detector 1 of FIG. 1 and adapted to discharge lightning surge currents entering protected equipment from wire lines of a power line or communications line to a ground-wire side and thereby protect the protected equipment. The surge protective device 50 is made up of a jack board 51 and a plug 52 and structured such that a casing 70 of the plug 52 will be insertably/separably fitted in a casing 60 of the jack board 51.

The casing 60 of the jack board 51 is made up of a substantially box-shaped base portion 61 and a pair of side walls 62 and 63 extending upward from opposite flanks of the base portion 61. A region surrounded by the base portion 61 and side walls 62 and 63 form a plug housing 64 adapted to insertably/separably house the plug 52. A bottom face of the base portion 61 is structured to straddle mounting rails for devices (e.g., DIN rails) 80 and removably fix the jack board 51 to the DIN rails 80.

The DIN rails 80 are device mounting hardware with a width of, for example, 35 mm stipulated by the DIN standard (Deutsche Norman). The DIN standard stipulates mounting rails for electrical devices such as switches and industrial terminal blocks used at 1000 VAC or below or at 1500 VDC or below.

A line-side terminal unit (not shown) for use to insert and fasten a terminal portion of a line-side wire connected to the wire lines of the power line or communications line is installed inside one 62 of the side walls. A wire entry port (not shown) for use to insert the terminal portion of the line-side wire is formed in a lateral surface of the side wall 62. A screw hole 62c for use to insert a screw of the line-side terminal unit is formed in a top face of the side wall 62.

Similarly, a ground-side terminal unit for use to insert and fasten the first terminal unit 3 of the lightning surge detector 1 is installed inside the other side wall 63. Two terminal unit entry ports—upper and lower terminal unit entry ports 63a and 63b—for use to insert the first terminal unit 3 of the lightning surge detector 1 are formed in a lateral surface of the side wall 63. The upper terminal unit entry port 63a is used to insert the lug 3a of the first terminal unit 3 and the lower terminal unit entry port 63b is used to insert the lug 3c of the first terminal unit 3. A screw hole 63c for use to insert a screw of the ground-side terminal unit is formed in a top face of the side wall 63.

A replacement warning terminal 65 is detachably attached below the wire entry port (not shown) in the lateral surface of one 62 of the side walls.

The casing 70 of the plug 52 has the shape of a substantially rectangular parallelepiped and contains a lightning protection circuit (not shown).

Figure 7:
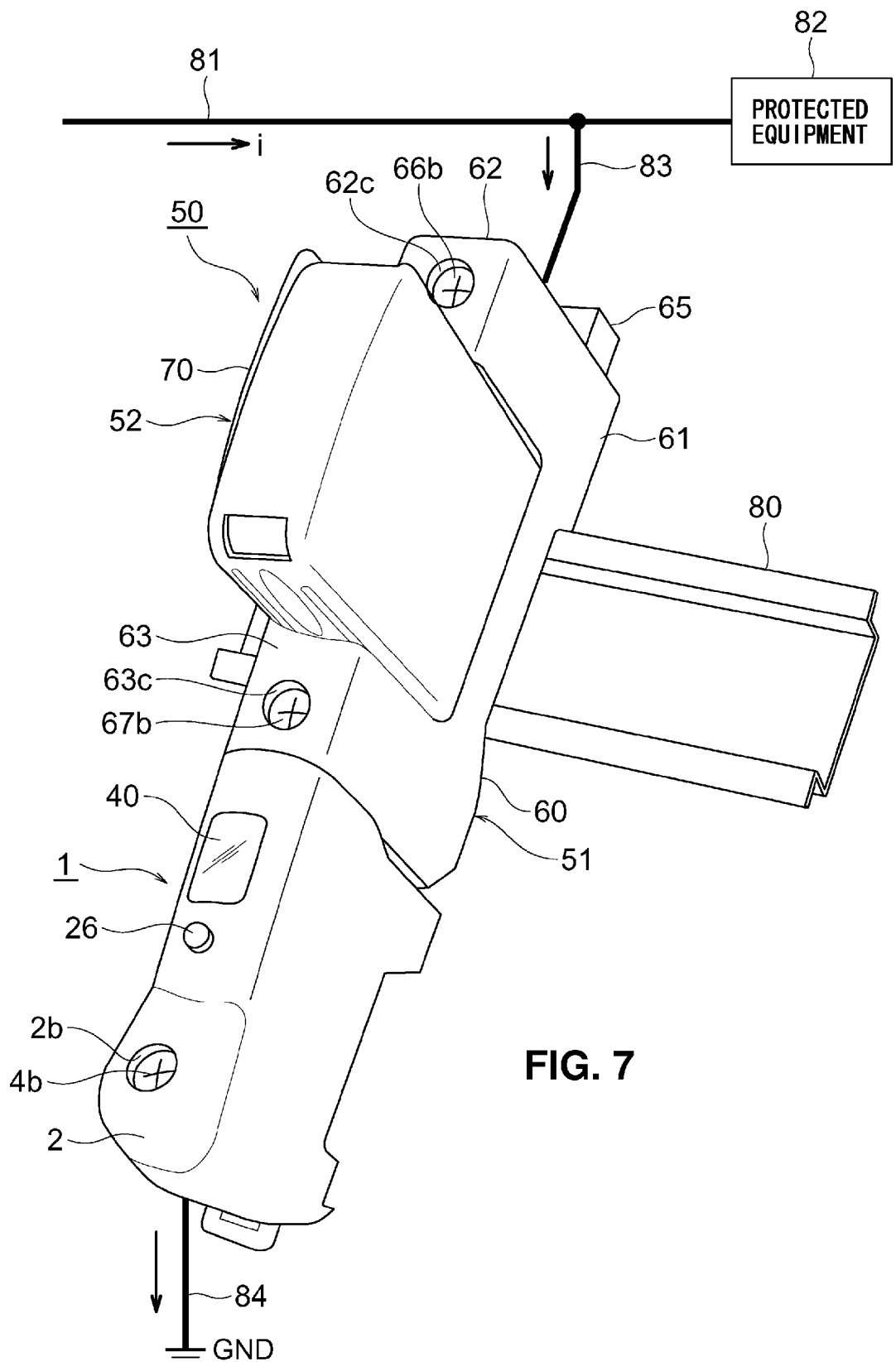
FIG. 7 is a schematic perspective view showing a structure of a surge protective device 50 outfitted with the lightning surge detector 1 of FIG. 1.

FIG. 7 is a schematic perspective view showing the structure of the surge protective device 50 outfitted with the lightning surge detector 1 of FIG. 1. Furthermore, FIG. 8 is a schematic see-through perspective view showing an internal structure of FIG. 7.

As shown in FIGS. 7 and 8, the surge protective device 50 outfitted with the lightning surge detector 1 is adapted to protect protected equipment 82 connected to the wire line 81 of the power line or communications line from lightning surge currents i. For use, the terminal portion of a line-side wire 83 connected to the wire line 81 is fastened by being inserted in the wire entry port (not shown) on the side of the side wall 62 of the surge protective device 50 while a terminal portion of a ground wire 84 connected to the ground GND is fastened by being inserted in the ground wire entry port 2a of the lightning surge detector 1.

Inside the side wall 62 of the surge protective device 50, a line-side terminal unit 66 made of metal and used to insert and fasten the line-side wire 83 is mounted at a location facing the wire entry port (not shown) and screw hole 62c. The line-side terminal unit 66 is made up of a support frame 66a substantially U-shaped in cross section, a screw 66b inserted in a vertical direction through the screw hole 62c, and a fixed frame 66c substantially rectangular in cross section. The support frame 66a is fixed inside the side wall 62, being made up of a first strip and second strip facing each other and a bottom strip adapted to couple the first strip and second strip, where the bottom strip is placed in a vertical direction while the first strip and second strip are placed in a horizontal direction. The first strip of the support frame 66a is located directly below the screw hole 62c and penetrated by the screw 66b. The fixed frame 66c is attached to a lower end of the screw 66b in such a way as to be movable in an up and down direction. A terminal portion of the line-side wire 83 is inserted through the wire entry port (not shown) into the fixed frame 66c. When the screw 66b is tightened, the fixed frame 66c moves up and down, causing the terminal portion of the line-side wire 83 to be fixed to the line-side terminal unit 66.

Similarly, inside the side wall 63 of the surge protective device 50, a ground-side terminal unit 67 made of metal and used to insert and fasten the first terminal unit 3 of the lightning surge detector 1 is mounted at a location facing the terminal unit entry ports 63a and 63b and screw hole 63c. The ground-side terminal unit 67 is made up of a support frame 67a substantially U-shaped in cross section, a screw 67b inserted in a vertical direction through the screw hole 63c, and a fixed frame 67c substantially rectangular in cross section. The support frame 67a is fixed inside the side wall 63, being made up of a first strip and second strip facing each other and a bottom strip adapted to couple the first strip and second strip, where the bottom strip is placed in a vertical direction while the first strip and second strip are placed in a horizontal direction. The first strip of the support frame 67a is located directly below the screw hole 63c and penetrated by the screw 67b. The fixed frame 67c is attached to a lower end of the screw 67b in such a way as to be movable in an up and down direction. Of the two lugs—upper and lower lugs 3a and 3c—on the side of the lightning surge detector 1 inserted, respectively, through the two terminal unit entry ports—upper and lower terminal unit entry ports 63a and 63b, the upper lug 3a is inserted between a head of the screw 67b and the first strip located below while the lower lug 3c is inserted into the fixed frame 67c. As the screw 67b is tightened, the two lugs—upper and lower lugs 3a and 3c—are fixed together to the ground-side terminal unit 67 by two-point contact.

In the surge protective device 50, the line-side terminal unit 66 inside the side wall 62 and the ground-side terminal unit 67 inside the side wall 63 are interconnected via a lightning protection circuit 70 installed in the plug 52 as indicated by an arrow in FIG. 8. The lightning protection circuit 70 is made up of one or more lightning protection devices such as arresters, varistors, and/or semiconductor devices intended to suppress lightning surge currents entering through the line-side terminal unit 66.

Figure 9A:
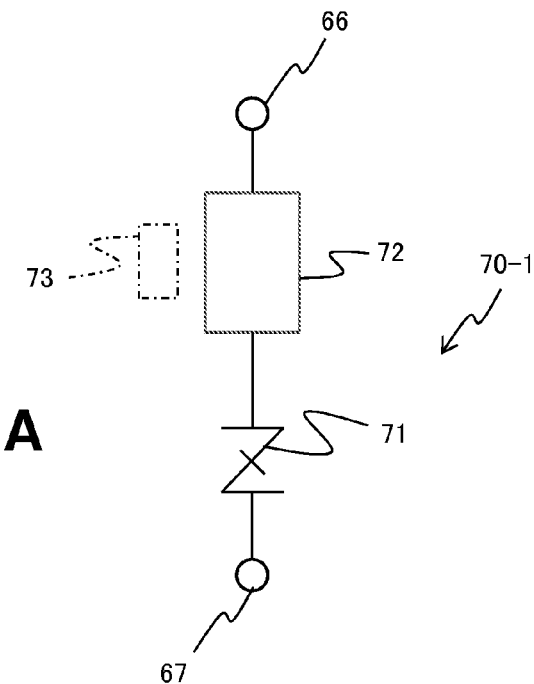
FIGS. 9A to 9C are circuit diagrams showing exemplary configurations of lightning protection circuits 70 shown in FIG. 8.
Figure 9B:
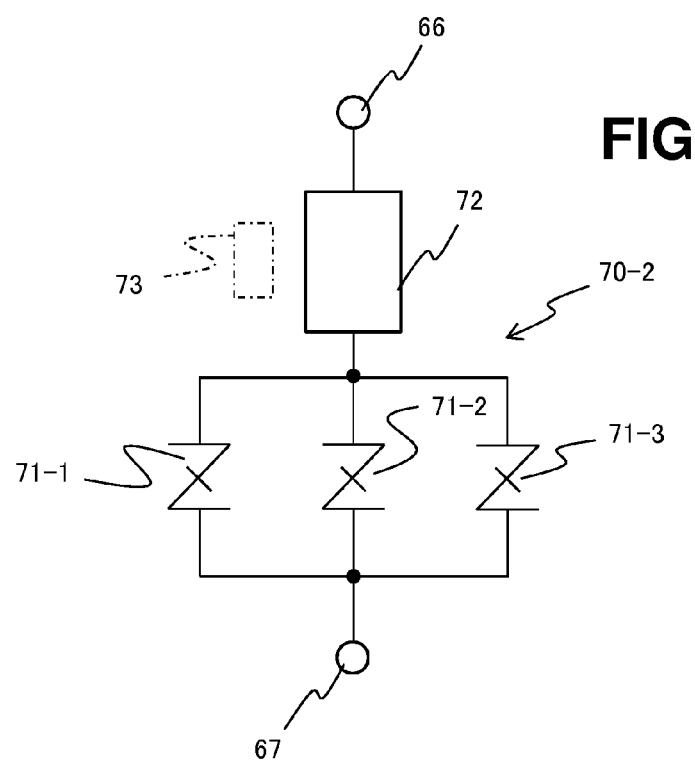
Figure 9C:
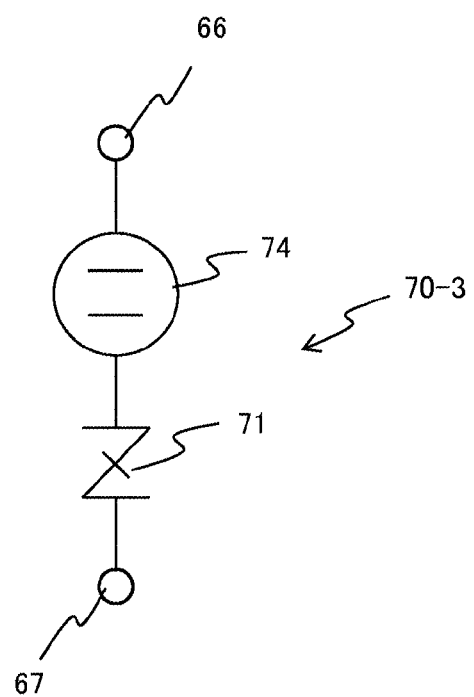

FIGS. 9A, 9B, and 9C are circuit diagrams showing exemplary configurations of the lightning protection circuits 70 (=70-1, 70-2, and 70-3) shown in FIG. 8.

As shown in FIG. 9A, the lightning protection circuit 70-1 includes a varistor 71 and a disconnect mechanism 72, which are connected in series between the line-side terminal unit 66 and ground-side terminal unit 67. The ground-side terminal unit 67 is connected to the conducting coupling bar 5 via the first terminal unit 3 of the lightning surge detector 1 shown in FIGS. 2 and 8, with the detection coil 7 being placed in the vicinity of the conducting coupling bar 5.

The varistor 71 is an element which becomes short-circuited and conducts a lightning surge current when a lightning surge voltage is applied. The varistor 71 can cause large leakage currents or get burnt out when deteriorated by too large a current. Therefore, the disconnect mechanism 72 is provided to disconnect the varistor 71 from the circuit. The disconnect mechanism 72 is made of a soldering material which melts when the varistor 71 is heated to or above a prescribed temperature. A sensor 73 may be provided to detect that the disconnect mechanism 72 has come into action. A detection signal of the sensor 73 is designed to be outputted from the replacement warning terminal 65 of FIG. 8 as a warning signal for replacement of the surge protective device due to deterioration of internal parts.

For example, if a lightning surge voltage is applied between the line-side terminal unit 66 and ground-side terminal unit 67, the varistor 71 is short-circuited, causing the lightning surge current flowing in through the line-side terminal unit 66 to be discharged to the ground-side terminal unit 67 by passing through the disconnect mechanism 72 and varistor 71. This protects the protected equipment 82 of FIG. 7 connected to the side of the line-side terminal unit 66.

The lightning protection circuit 70-2 shown in FIG. 9B includes plural varistors 71-1 to 71-3 connected in parallel and a disconnect mechanism 72, with the plural varistors 71-1 to 71-3 and the disconnect mechanism 72 being connected in series between the line-side terminal unit 66 and ground-side terminal unit 67. The lightning protection circuit 70-2 has functions similar to those of the lightning protection circuit 70-1 shown in FIG. 9A, but has a higher withstand voltage and withstand current than the lightning protection circuit 70-1 of FIG. 9A because of the plural varistors 71-1 to 71-3 connected in parallel.

The lightning protection circuit 70-3 shown in FIG. 9C includes an arrester 74 and varistor 71, which are connected in series between the line-side terminal unit 66 and ground-side terminal unit 67.

For example, if a lightning surge voltage is applied between the line-side terminal unit 66 and ground-side terminal unit 67 and consequently a lightning surge current is inputted to the line-side terminal unit 66, the arrester 74 discharges, causing the lightning surge current to be discharged to the ground-side terminal unit 67 by passing through the varistor 71. This protects the protected equipment 82 connected to the side of the line-side terminal unit 66.

Incidentally, if the arrester 74 is used alone for the lightning protection circuit 70-3, after the arrester 74 discharges with an impulsive lightning surge current, the arrester may have its life shortened or may be even burnt out due to the phenomenon of follow current in which discharging is sustained by an AC current even after extinction of the impulsive current. To interrupt such follow currents, the arrester 74 and varistor 71 are connected in series.

FIG. 10 is a diagram showing correlation values between lightning surge currents flowing through the conducting coupling bar 5 of FIG. 4 and voltage values of the waveform-modified voltage S14 outputted from the waveform processing unit 10.

The correlation values shown in FIG. 10 have been calculated assuming that the first winding 7b and second winding 7c of the detection coil 7 have 120 turns (T) in total. The correlation values are prestored in the memory 22 of the computation control unit 20 shown in FIG. 5.

Operation of Surge Protective Device Equipped with Lightning Surge Detector According to First Embodiment Operation of the surge protective device 50 equipped with the lightning surge detector 1 shown in FIGS. 7 and 8 will be described assuming, for example, that a lightning surge voltage is generated between the line-side terminal unit 66 and ground-side terminal unit 67 as a result of a lightning strike or the like.

When a lightning surge voltage is generated between the line-side terminal unit 66 and ground-side terminal unit 67 of the surge protective device 50 shown in FIG. 8, the arrester 74 between the line-side terminal unit 66 and ground-side terminal unit 67 of the lightning protection circuit 70-3 shown in FIG. 9C discharges and a lightning surge current i is discharged from the line-side terminal unit 66 to the ground-side terminal unit 67 through the arrester 74 and varistor 71. This protects the protected equipment 82 connected to the line-side terminal unit 66.

The lightning surge current i discharged to the ground-side terminal unit 67 flows through the first terminal unit 3, the conducting coupling bar 5, second terminal unit 4, and ground wire 84 in the lightning surge detector 1 to the ground GND. In the lightning surge detector 1 shown in FIG. 5, when the lightning surge current i flows through the conducting coupling bar 5, an induction current I3 is induced in the detection coil 7 placed in the vicinity of the conducting coupling bar 5. The induction current I3 induced in the detection coil 7 is full-wave rectified by the full-wave rectifier circuit 12 via the overvoltage prevention circuit 11 of the waveform processing unit 10.

The induction current subjected to full-wave rectification is converted into a voltage by the I/V conversion circuit 13 to generate the detection voltage S13. The voltage waveform of the generated detection voltage S13 is stretched along the time axis by the time constant circuit 14 to generate a waveform-modified voltage S14, which is then sent to the input port 23 of the computation control unit 20.

On the other hand, a maximum voltage value of the detection voltage S13 is limited to or below a fixed value by the voltage limiter circuit 15 to generate the start-up voltage S15. The generated start-up voltage S15 is sent to the input port 23 of the computation control unit 20 to wake up the CPU 21 from a sleep state. The CPU 21 usually stays in a sleep state to reduce power consumption and is woken up when the start-up voltage S15 is inputted.

Figure 11:
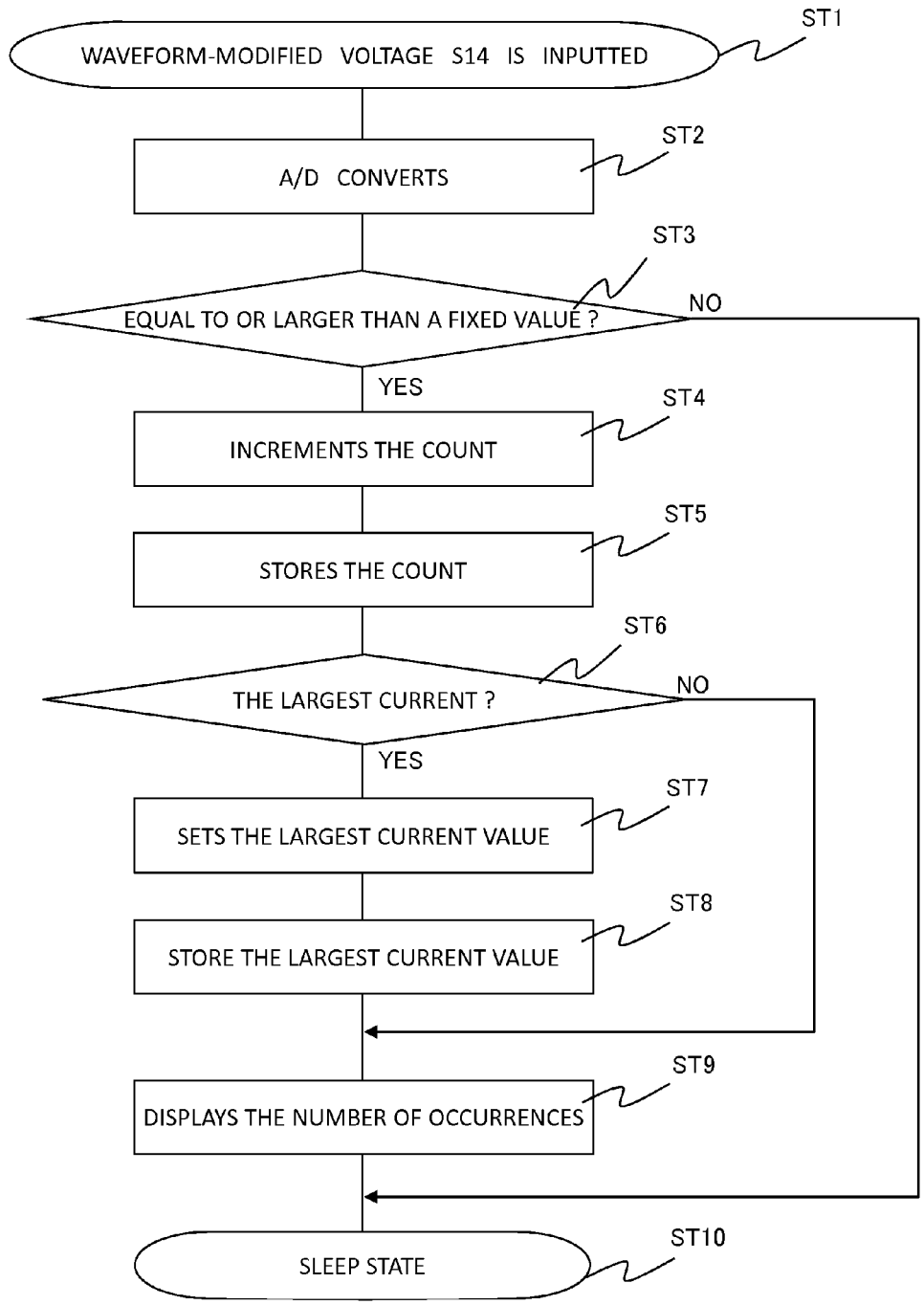
FIG. 11 is a flowchart showing a process after wakeup of a computation control unit 20 shown in FIG. 5.

FIG. 11 is a flowchart showing a process after wakeup of the computation control unit 20 shown in FIG. 5.

When the CPU 21 of the computation control unit 20 wakes up from sleep state, the computation control unit 20 performs the processes of steps ST1 to ST10 in FIG. 11.

In step ST1, the waveform-modified voltage S14 is inputted to the input port 23 of the computation control unit 20. In step ST2, under the control of the CPU 21, the input port 23 converts the inputted waveform-modified voltage S14 into a digital signal and sends the digital signal to the CPU 21. In step ST3, with reference to the correlation values of FIG. 10 stored in the memory 22, the CPU 21 calculates the current value of the lightning surge current from the voltage value of the waveform-modified voltage S14 subjected to conversion into a digital signal, thereby produces a lightning surge current calculation result, and determines whether or not the lightning surge current calculation result is equal to or larger than a fixed value (e.g., 100 A). If the lightning surge current calculation result is smaller than the fixed value (NO), the CPU 21 goes to step ST10, enters a sleep state, and thereby finishes processing.

If it is found in step ST3 that the lightning surge current calculation result is equal to or larger than the fixed value (YES), the CPU 21 goes to step ST4. In step ST4, the CPU 21 increments the count by 1, In step ST5, stores the count in the memory 22, and goes to step ST6. In step ST6, the CPU 21 determines whether or not the lightning surge current calculation result thus produced is the largest current so far. If the determination result does not indicate the largest current (NO), the CPU 21 goes to step ST9. If the determination result indicates the largest current (YES), the CPU 21 goes to step ST7.

In step ST7, the CPU 21 sets the largest current value. Then, the CPU 21 goes to step ST8 to store the largest current value in the memory 22, and then goes to step ST9. In step ST9, based on the lightning surge current calculation result stored in the memory 22, the CPU 21 displays the number of occurrences (count) and the like of lightning surge currents on the display unit 40 via the output port 25 for a short period of time. Then, the CPU 21 goes to step ST10, enters a sleep state, and thereby finishes processing.

Figure 12A:
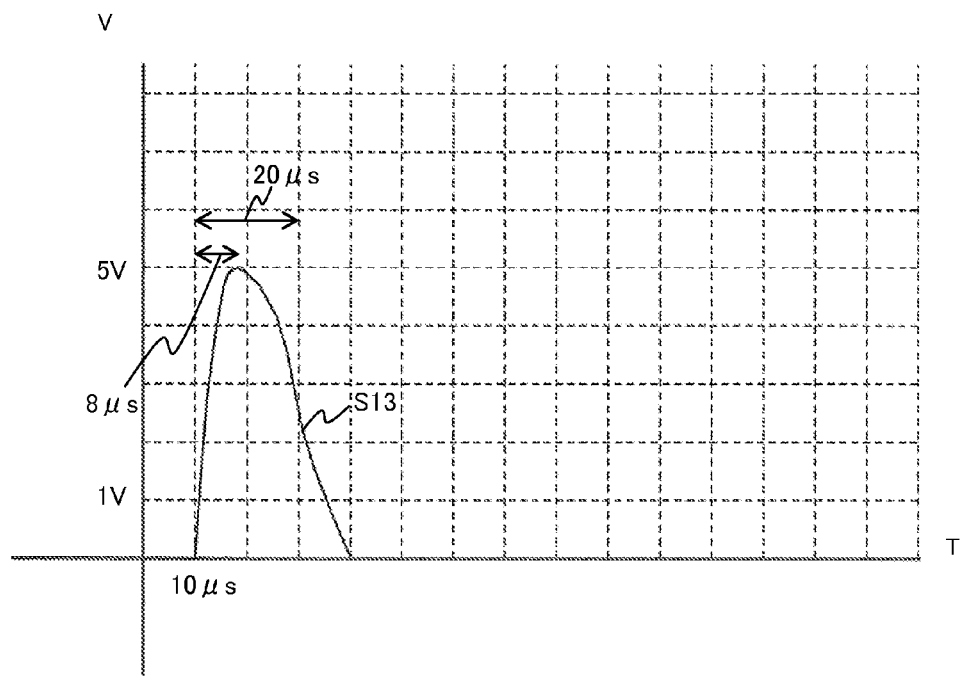
FIG. 12A is a waveform chart showing a detection voltage S13 of FIG. 5.
Figure 12B:
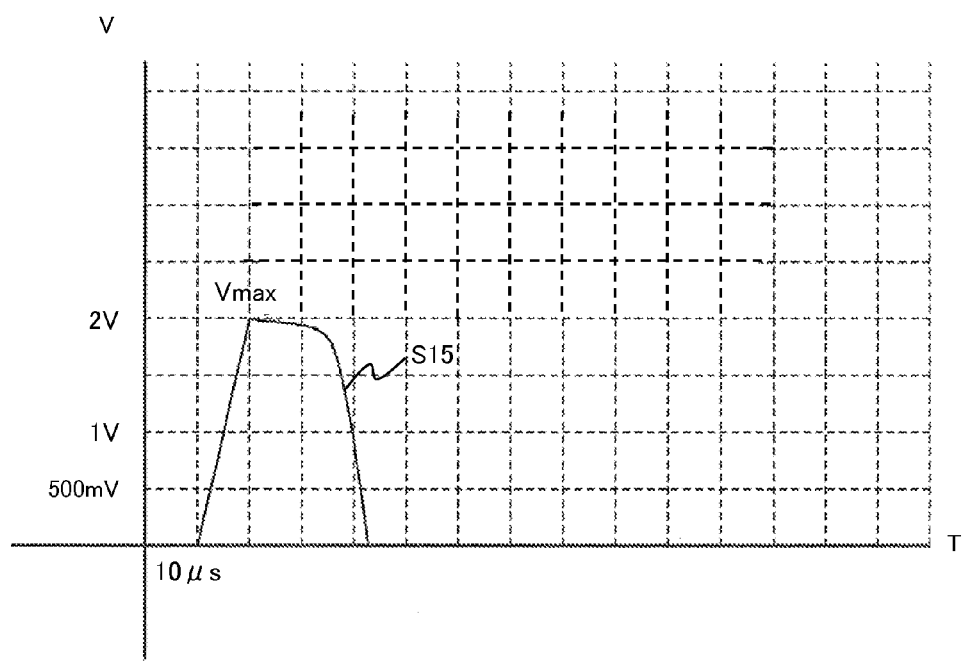
FIG. 12B is a waveform chart showing a start-up voltage S15 of FIG. 5.
Figure 12C:
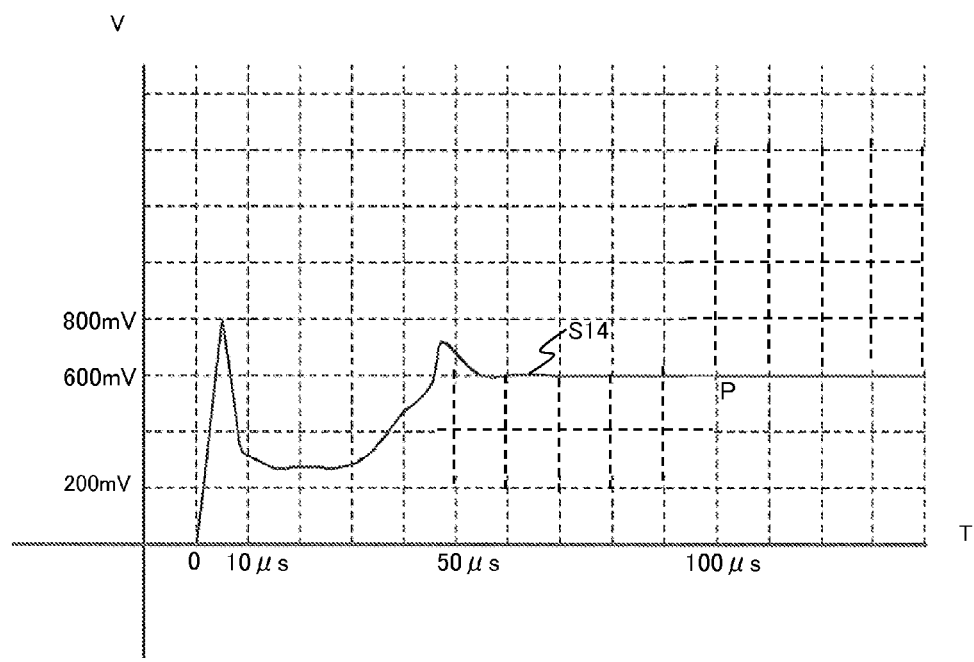
FIG. 12C is a waveform chart showing the voltage values of the waveform-modified voltage S14 shown in FIG. 5.

FIGS. 12A, 12B, and 12C are diagrams showing signal waveforms of various parts shown in FIG. 5.

FIG. 12A is a waveform chart showing an example of the detection voltage S13 which results when a lightning surge current flows through the conducting coupling bar 5 shown in FIG. 4, where the abscissa represents time (T) (each graduation on the abscissa indicates 10 μs) while the ordinate represents voltage (V) (each graduation on the ordinate indicates 1 V).

The waveform of the detection voltage S13 is, for example, an 8/20-μs waveform. When an impulsive lightning surge current flows through the conducting coupling bar 5, the detection voltage S13 rises abruptly, reaches a maximum voltage value of 5 V after a time of 8 μs, and subsequently falls. After 20 μs from the rise, the detection voltage S13 decreases to 50% (=2.5 V) the maximum voltage value of 5 V.

FIG. 12B is a waveform chart showing an example of the start-up voltage S15 shown in FIG. 5, where the abscissa represents time (T) (each graduation on the abscissa indicates 10 μs) while the ordinate represents voltage (V) (each graduation on the ordinate indicates 500 mV).

In the waveform of the start-up voltage S15, the maximum voltage value Vmax is limited to or below 2.0 V by the voltage limiter circuit 15. When a lightning surge current flows through the conducting coupling bar 5, the start-up voltage S15 outputted from the voltage limiter circuit 15 rises to the maximum voltage value Vmax (e.g., 2.0 V or below), waking up the CPU 21 from a sleep state.

FIG. 12C is a waveform chart showing the voltage values of the waveform-modified voltage S14 shown in FIG. 5, where the abscissa represents time (T) (each graduation on the abscissa indicates 10 μs) while the ordinate represents voltage (V) (each graduation on the ordinate indicates 200 mV).

The waveform-modified voltage S14 rises together with the detection voltage S13 and reaches a maximum voltage value of 800 mV by the time of T=10 μs. Subsequently, the waveform-modified voltage S14 falls to or below a minimum voltage value of 300 mV at around the time of T=20 μs to 30 μs. The waveform-modified voltage S14 rises again with the voltage value reaching about 700 mV at around the time of T=47 μs. The waveform-modified voltage S14 falls again with the voltage value reaching about 600 mV at around the time of T=55 μs. Subsequently, the waveform-modified voltage S14 enters a stable zone in which a voltage value of 600 mV is maintained. Therefore, using the time at which the waveform-modified voltage S14 enters the stable zone after the time of T=100 μs as a reading point (P), the CPU 21 reads the voltage value of 600 mV of the waveform-modified voltage S14 by converting the voltage value into a digital signal at the input port 23. Then, by referring to the correlation values (i.e., the start-up voltage of 2.0 V, the voltage value of 650 mV of the waveform-modified voltage S14, and the lightning surge current of 400 A) of FIG. 10 stored in the memory 22 and using a proportional expression, the CPU 21 calculates the current value (=600 (mV)×400 (A)/650 (mV)≅369.23) of the lightning surge current at the voltage value of 600 mV of the waveform-modified voltage S14 and thereby produces the lightning surge current calculation result.

In this way, to reduce power consumption, the CPU 21 of the computation control unit 20 is usually kept in a sleep state. On the other hand, the waveform of an impulsive lightning surge current lasts for an extremely short time. Therefore, a wave tail of the waveform of the detection voltage S13 corresponding to the waveform of the lightning surge current is stretched by the waveform processing unit 10, thereby generating the waveform-modified voltage S14. Consequently, even if the waveform-modified voltage S14 is read slowly after wakeup, the CPU 21 can calculate the magnitude of lightning surge current precisely.

Under the control of the CPU 21, the display unit 40 displays minimum necessary lightning surge information and the like retrieved from the memory 22 for a short period of time. The reason for the short display period is to reduce power consumption. As an operation history of lightning surge currents, for example, the display unit 40 numerically displays the number of occurrences of lightning surge currents or displays lightning surge current calculation results, a replacement indicator for the surge protective device 50, a battery replacement indicator, and the like (if a battery 35 is installed in the lightning surge detector 1) by flashing LEDs.

To view lightning surge information and the like, the view button 26 in FIG. 5 is pressed. When the view button 26 is pressed, the CPU 21 displays the lightning surge information and the like stored in the memory 22 on the display unit 40. This allows the lightning surge information and the like to be viewed from outside at any time.

Also, in response to a request from a monitor unit (not shown), the lightning surge information and the like are read out by the CPU 21 and sent to the monitor unit via the I/O port 24, connector 28, and communications line 29.

Advantages of First Embodiment

The lightning surge detector 1 and surge protective device 50 according to this first embodiment provide advantages (a) to (e) below.

(a) In the lightning surge detector 1, since the detection coil 7 with a substantially U-shaped cross section is structured to straddle the conducting coupling bar 5 via an insulating member to detect lightning surge currents with respect to ground, the portion for detecting the lightning surge currents can be downsized. In particular, the detection coil 7, which has a connection configuration such as shown in FIG. 3B or 3F can detect lightning surge currents with high accuracy without being affected by external magnetic fields. Moreover, the lightning surge detector 1, which is made up of a small number of parts, has a simple structure and readily allows its overall shape to be downsized.

(b) Since the lightning surge detector 1 detects a lightning surge current flowing through the conducting coupling bar 5 using the detection coil 7 placed in the vicinity of the conducting coupling bar 5, stretches the voltage waveform of the detection voltage S13 along the time axis using the waveform processing unit 10, and subsequently calculates the current value of the lightning surge current using the CPU 21 in the computation control unit 20, even small impulsive lightning surge currents can be detected with high accuracy.

(c) Since the lightning surge detector 1 can be joined integrally to the surge protective device 50 when the first terminal unit 3 of the lightning surge detector 1 is inserted into the ground-side terminal unit 67 of the surge protective device 50 and fixed thereto by the screw 67*b*, the surge protective device 50 equipped with the lightning surge detector 1 can be made small in size. Moreover, since the joining portion between the first terminal unit 3 and ground-side terminal unit 67 is shaped to contact at two points, the lightning surge detector 1 can be firmly joined integrally to the surge protective device 50.

(d) With the surge protective device 50 equipped with the lightning surge detector 1, since summary information (e.g., the number of times lightning surge currents have been detected, magnitudes of the lightning surge currents, a replacement indicator for the surge protective device 50, a battery replacement indicator, and the like—if a battery 35 is installed in the lightning surge detector 1) about lightning surge currents and the like flowing through the surge protective device 50 is displayed on the display unit 40, the summary information can be viewed visually.

(e) Since the surge protective device 50 equipped with the lightning surge detector 1 is configured to be able to transmit the summary information about lightning surge currents and the like to the communications line 29 via the connector 28 in the lightning surge detector 1, the operation and state of deterioration of the surge protective device 50 equipped with the lightning surge detector 1 can be managed from an external monitor unit or the like. Configuration of a management system for the surge protective device will be described later with reference to a second embodiment.

Second Embodiment

Figure 13:
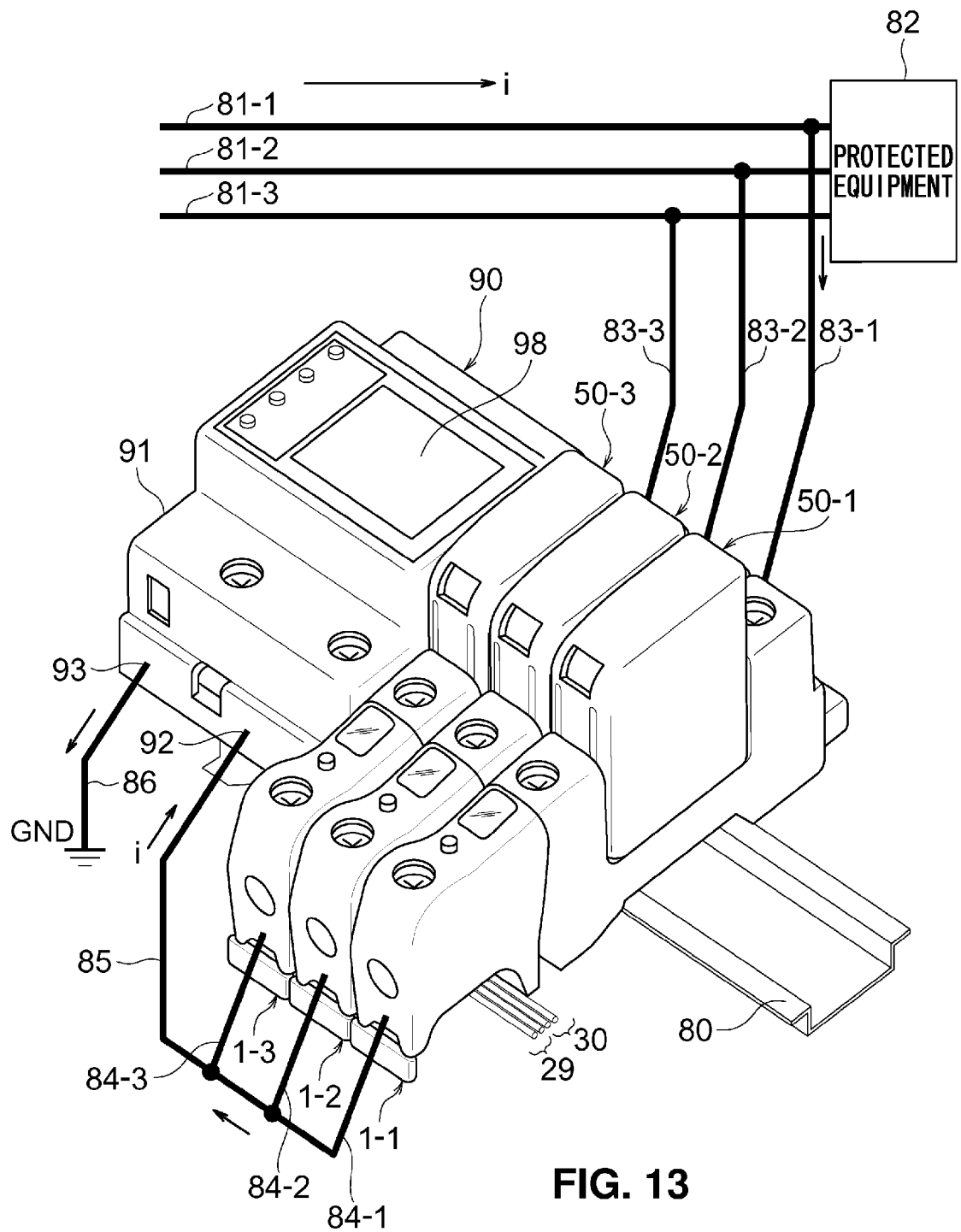
FIG. 13 is a configuration diagram outlining a local management system for surge protective devices according to a second embodiment of the present invention.

Configuration of Management System for Surge Protective Devices According to Second Embodiment of the Present Invention FIG. 13 is a configuration diagram outlining a local management system for surge protective devices according to a second embodiment of the present invention.

As shown in FIG. 13, the local management system for surge protective devices is installed at a lightning surge monitoring site and adapted to protect pieces of the protected equipment 82 connected to respective wire lines 81-1, 81-2, 81-3 of a three-wire power line from lightning surge currents i. The management system is made up of a plurality of the lightning surge detectors 1 shown in FIG. 1 (e.g., three lightning surge detectors 1-1, 1-2, and 1-3), a plurality of the surge protective devices 50 shown in FIG. 6 (e.g., three surge protective devices 50-1, 50-2, and 50-3), and a single monitor unit 90, which are installed side by side closely without spacing.

The three lightning surge detectors 1-1 to 1-3 are outfitted on the three surge protective devices 50-1 to 50-3, respectively. The three surge protective devices 50-1 to 50-3 and single monitor unit 90 are mounted next to each other on the DIN rails 80. The three surge protective devices 50-1 to 50-3 are connected, respectively, to the wire lines 81-1 to 81-3 via line-side wires 83-1 to 83-3. Ground wires 84-1 to 84-3 connected, respectively, to the three lightning surge detectors 1-1 to 1-3 are bundled and connected to a single common ground wire 85, which in turn is connected to the monitor unit 90.

The monitor unit 90 has a substantially box-shaped casing 91. A first terminal unit 92 and second terminal unit 93 are installed on a flank of the casing 91. Furthermore, a display unit 98 is installed on a top face of the casing 91. The first terminal unit 92 is connected to the common ground wire 85. Furthermore, the second terminal unit 93 is connected to the ground GND via a ground wire 86. The display unit 98 is adapted to display information (e.g., the number of operations, operating time, and the like of each of the surge protective devices 50-1 to 50-3) about lightning surge currents and the like flowing through the individual lightning surge detectors 1-1 to 1-3 and is made up of a liquid crystal display, LEDs or the like.

Figure 14:
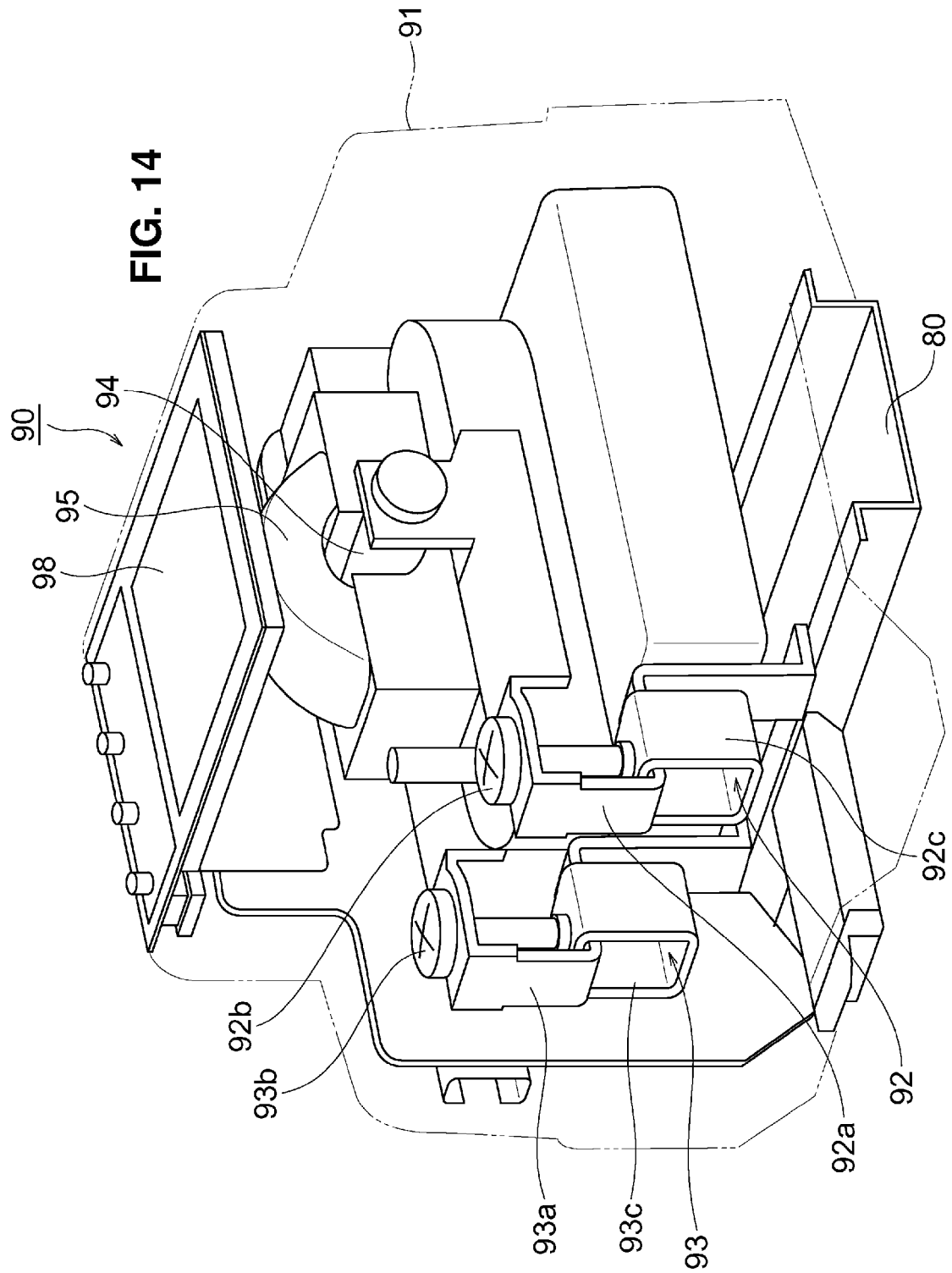
FIG. 14 is a see-through view showing a monitor unit 90 of FIG. 13.

FIG. 14 is a see-through view showing the monitor unit 90 of FIG. 13.

As shown in FIG. 14, the first terminal unit 92 is made up of a support frame 92*a* substantially U-shaped in cross section, a screw 92*b*, and a fixed frame 92*c* substantially rectangular in cross section as with the line-side terminal unit 66 or ground-side terminal unit 67 of the surge protective device 50 shown in FIG. 8. The support frame 92*a* is fixed inside a flank of the casing 91, being made up of a first strip and second strip facing each other and a bottom strip adapted to couple the first strip and second strip, where the bottom strip is placed in a vertical direction while the first strip and second strip are placed in a horizontal direction. The first strip of the support frame 92*a* is penetrated by the screw 92*b* in the vertical direction. The fixed frame 92*c* is attached to a lower end of the screw 92*b* in such a way as to be movable in an up and down direction. A terminal portion of the common ground wire 85 is inserted through the wire entry port (not shown) into the fixed frame 92*c*. When the screw 92*b* is tightened, the fixed frame 92*c* moves up and down, causing the terminal portion of the common ground wire 85 to be fixed to the first terminal unit 92.

The second terminal unit 93 is made up of a support frame 93*a* substantially U-shaped in cross section, a screw 93*b*, and a fixed frame 93*c* substantially rectangular in cross section as with the first terminal unit 92. A terminal portion of the common ground wire 86 is inserted through the wire entry port (not shown) into the fixed frame 93*c*. When the screw 93 is tightened, the fixed frame 93*c* moves up and down, causing the terminal portion of the ground wire 86 to be fixed to the second terminal unit 93.

The first terminal unit 92 and second terminal unit 93 are coupled together by a conducting coupling bar 94. An instrument current transformer (hereinafter referred to as a "CT") 95 is fitted around a periphery of the conducting coupling bar 94 at predetermined spacing. The CT 95 is adapted to detect lightning surge currents flowing through the conducting coupling bar 94, and a control unit and the like (not shown) are connected to an output side of the CT 95.

Figure 15:
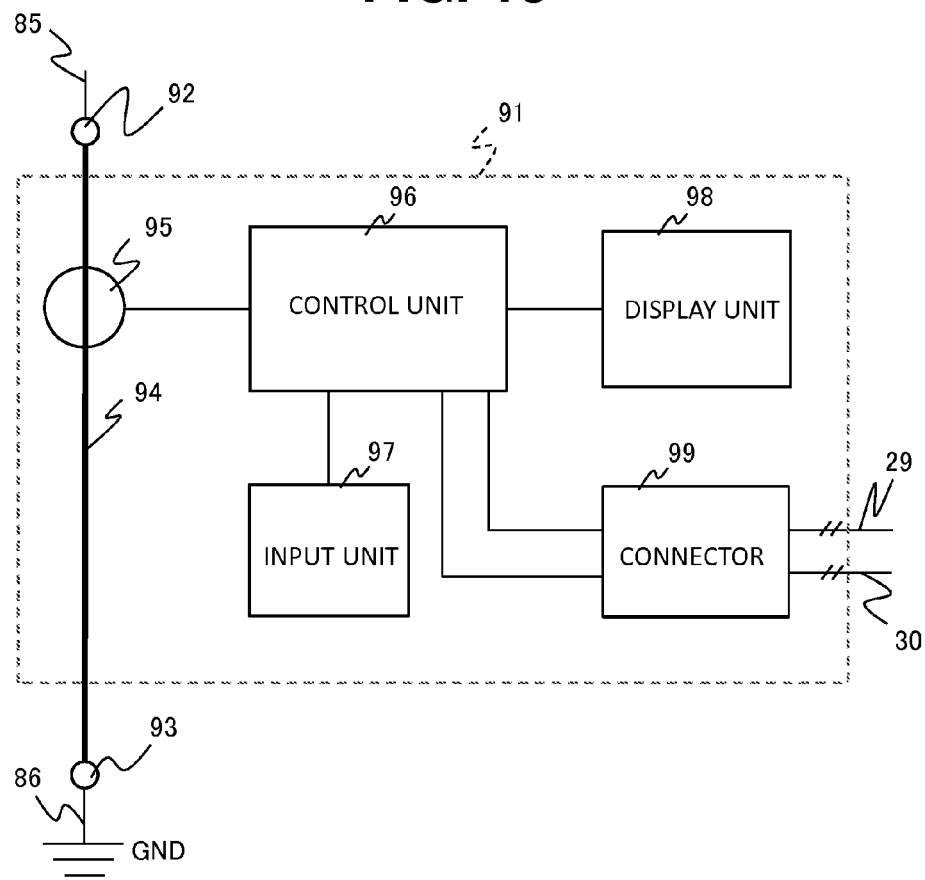
FIG. 15 is a block diagram showing a schematic circuit configuration of the monitor unit 90 shown in FIG. 14.

FIG. 15 is a block diagram showing a schematic circuit configuration of the monitor unit 90 shown in FIG. 14.

As shown in FIG. 15, a control unit 96 is connected to the output side of the CT 95. The control unit 96 is adapted to control the entire monitor unit 90 under program control and is made up of a CPU, a memory, an I/O port, and the like. The control unit 96 is connected with an input unit 97 including a display button and the like placed in or near the display unit 98 as well as with the display unit 98, a connector 99, and the like. The connector 99 is connected with a two-wire communications line 29 and a two-wire power line 30. The control unit 96 has functions to receive electric power from the power line 30 and communicate with external lightning surge detectors 1-1 to 1-3 via the communications line 29.

Operation of Management System for Surge
Protective Devices According to Second
Embodiment In the management system for surge protective devices shown in FIG. 13, the monitor unit 90 shown in FIGS. 14 and 15 operates as described in (a) and (b) below.

(a) When a lightning surge current i flows through the common ground wire 85 as indicated by an arrow in FIG. 13, the lightning surge current i is detected by the CT 95, and the control unit 96 calculates a current value, stores the current value in an internal memory, and puts a time stamp as well.

Furthermore, the control unit 96 inquires of the individual lightning surge detectors 1 (=1-1 to 1-3) attached to the respective surge protective devices 50 (=50-1 to 50-3) about the presence or absence of a lightning surge current via the communications line 29 connected to the connector 99. Subsequently, the control unit 96 stores contents of a response (e.g., the presence or absence, current value, and the like of a lightning surge current) from each lightning surge detector 1 in the internal memory.

(b) When a display command is outputted to the display unit 98 from the control unit 96, for example, at the press of the display button in the input unit 97, the control unit 96 causes various information (e.g., date and time which represent operation history, current value, and the like) on each lightning surge detector 1 to be displayed on the display unit 98, the information being stored in the internal memory.

Advantages of Second Embodiment

The second embodiment provides advantages (1) to (3) below.

(1) Since the management system for surge protective devices is configured such that the plurality of surge protective devices 50-1, 50-2, and 50-3 each equipped with a lightning surge detector are installed side by side closely next to the single monitor unit 90 without spacing, the management system for surge protective devices can be made small in size. Also, the CT 95 installed in the monitor unit 90 allows detailed information about the lightning surge currents flowing through the common ground wire 85 to be grasped.

(2) To downsize the management system, the plurality of lightning surge detectors 1-1 to 1-3 are installed side by side closely without spacing, with the detection coil 7 in each lightning surge detector 1 having a connection configuration such as shown in FIG. 3B or 3F. Consequently, as shown in FIG. 3C or 3G, for example, when a lightning surge current flows through the conducting coupling bar 5A of the adjacent lightning surge detector 1-2, the lightning surge detector 1-1 does not recognize falsely that the lightning surge current is flowing through the conducting coupling bar 5 of the lightning surge detector 1-1. Therefore, each of the lightning surge detectors 1 can detect lightning surge currents with high accuracy without being affected by an external magnetic field H0 from the adjacent conducting coupling bar 5A.

(3) Detailed information (e.g., the number of lightning surges, magnitudes of lightning surge currents, times of occurrence of lightning surges, replacement indicators, and the like) on the individual surge protective devices 50-1 to 50-3 equipped with a lightning surge detector can be viewed and managed locally on the monitor unit 90.

Third Embodiment

Figure 16:
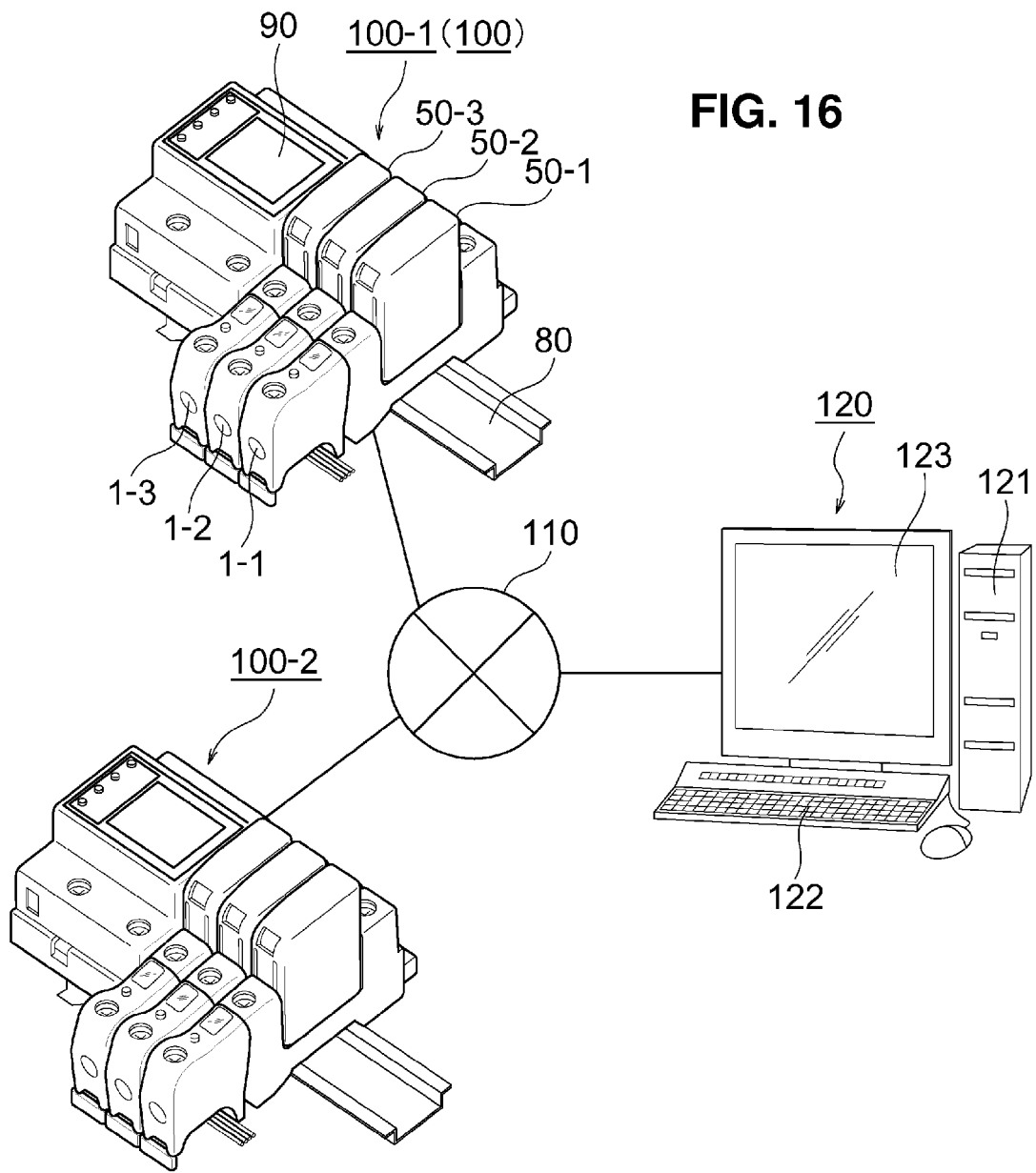
FIG. 16 is a configuration diagram outlining a remote management system for surge protective devices according to a third embodiment of the present invention.

Configuration of Management System for Surge
Protective Devices According to Third Embodiment
of the Present Invention FIG. 16 is a configuration diagram outlining a remote management system for surge protective devices according to a third embodiment of the present invention.

In the remote management system for surge protective devices shown in FIG. 16, a plurality of management blocks 100 (100-1, 100-2, . . . ) are installed, respectively, at a plurality of lightning surge monitoring sites, where each of the management blocks 100 is made up of a plurality of the surge protective devices 50-1 to 50-3 shown in FIG. 13 and a single monitor unit 90. The plurality of management blocks 100 (=100-1, 100-2, . . . ) are connected to a remote monitoring apparatus 120 via a network 110.

The monitoring apparatus 120 is adapted to remotely monitor operating condition, operation history, and the like of each of the management blocks 100-1, 100-2, and so forth, and made up of a personal computer or the like, which in turn is equipped with a control unit 121 made up of a CPU and the like as well as with an input unit 122 and display unit 123 each controlled by the control unit 121. The input unit 122 is made up of input devices such as a keyboard and mouse. Besides, the display unit 123 is a device controlled by the control unit 121 and adapted to display data and the like.

Operation of Management System for Surge
Protective Devices According to Third Embodiment The operating conditions, operation histories, and the like of the lightning surge detectors 1-1 to 1-3 outputted from the monitor units 90 of the respective management blocks 100-1, 100-2, and so forth are sent to the monitoring apparatus 120 via the network 110. The monitoring apparatus 120 monitors the operating condition, operation history, and the like of each of the management blocks 100-1, 100-2, and so forth.

Advantages of Third Embodiment

This third embodiment allows detailed information (e.g., the number of lightning surges, magnitudes of lightning surge currents, times of occurrence of lightning surges, replacement indicators, and the like) on the individual management blocks 100-1, 100-2, and so forth to be viewed and managed from the remote monitoring apparatus 120.

Variations of Embodiments

The present invention is not limited to the first to third embodiments described above, and various applications and variations are possible. Such applications and variations include, for example, (A) to (D) below.

(A) The lightning surge detector 1 of FIGS. 1 and 2 may be changed in configuration such that the first terminal unit 3 will have a terminal style similar to that of the second terminal unit 4 or that a general-purpose lightning surge detector with a general-purpose terminal style such as a crimp terminal will be connected to various already-installed or existing surge protective devices via a cable. This will allow a general-purpose lightning surge detector to be retrofitted to an already-installed or existing surge protective device, making it easy to construct a surge protective device equipped with a lightning surge detector.

(B) The management system for surge protective devices in FIG. 13 may be changed in configuration such that a plurality of the general-purpose lightning surge detectors described in (A) above and the monitor unit 90 shown in FIG. 13 will be placed next to each other on the DIN rails 80 or the like and connected with a plurality of already-installed or existing surge protective devices via a cable. This will allow the general-purpose lightning surge detector and the monitor unit 90 to be retrofitted to already-installed or existing surge protective devices, making it easy to construct a management system for surge protective devices.

(C) Although the surge protective device 50 in FIG. 6 has a structure in which the jack board 51 and plug 52 are separable, the structure may be changed such that the jack board 51 and plug 52 will be integrated into a single piece.

(D) The circuit configuration of the lightning surge detector 1 in FIG. 5, the circuit configurations of the lightning protection circuits 70-1 to 70-3 in FIGS. 9A to 9C, or the circuit configuration of the monitor unit 90 shown in FIG. 15 may be changed to circuit configurations other than those illustrated in the figures.

What is claimed is:

1. A lightning surge detector comprising:
a first terminal unit connected to a ground-side terminal unit of a surge protective device;
a second terminal unit connected with a ground wire;
a conducting coupling bar adapted to couple the first terminal unit and the second terminal unit;
a detection coil placed in a vicinity of the conducting coupling bar and adapted to output an induction current induced by a lightning surge current flowing through the conducting coupling bar;
a waveform processing unit adapted to convert the induction current into a voltage, thereby generating a detection voltage, perform a stretching process on a voltage waveform of the detection voltage along a time axis, and thereby output a waveform-modified voltage;
a computation control unit adapted to accept input of the waveform-modified voltage, calculate a current value of the lightning surge current from a voltage value of the waveform-modified voltage, and produce a lightning surge current calculation result; and
a display unit adapted to display the lightning surge current calculation result so as to be viewable from outside under the control of the computation control unit, wherein
the first terminal unit, the second terminal unit, the conducting coupling bar, the detection coil, the waveform processing unit, the computation control unit, and the display unit are unitized by being housed in a casing.

2. The lightning surge detector according to claim 1, wherein
the detection coil comprises:
a core arranged so as to embrace the conducting coupling bar, and
a pair of a first winding and a second winding wound around the core so as to be symmetrical to each other with respect to the conducting coupling bar; and
the first winding and the second winding are wound in a predetermined direction and connected in series under a predetermined connection condition such that the induction current will not flow when an external magnetic field is applied, and that the induction current will be outputted when the lightning surge current flows through the conducting coupling bar.

3. The lightning surge detector according to claim 1, wherein
the waveform processing unit comprises:
an overvoltage prevention circuit adapted to limit an overvoltage outputted from the detection coil to or below a fixed value;
a rectifier circuit adapted to rectify the induction current inputted via the overvoltage prevention circuit and thereby output a direct current;
a current/voltage conversion circuit adapted to convert the direct current into a voltage and thereby generate the detection voltage; and
a time constant circuit having a resistor and capacitor with a large time constant in order to perform the stretching process on the detection voltage.

4. The lightning surge detector according to claim 1, wherein
the computation control unit comprises:
an input port adapted to input the waveform-modified voltage:
an output port adapted to output the lightning surge current calculation result to the display unit;
an input/output port adapted to input and output signals; and
a central processing unit provided with a computation function and a control function; and
a memory adapted to store data including correlation data between the voltage value of the waveform-modified voltage and the current value of the lightning surge current in order to calculate the current value of the lightning surge current from the voltage value of the waveform-modified voltage.

5. A surge protective device detachably outfitted with a lightning surge detector which comprises a first terminal unit, a second terminal unit connected with a ground wire, a conducting coupling bar adapted to couple the first terminal unit and the second terminal unit, a detection coil placed in a vicinity of the conducting coupling bar and adapted to output an induction current induced by a lightning surge current flowing through the conducting coupling bar, a waveform processing unit adapted to convert the induction current into a voltage, thereby generating a detection voltage, perform a stretching process on a voltage waveform of the detection voltage along a time axis, and thereby output a waveform-modified voltage, a computation control unit adapted to accept input of the waveform-modified voltage, calculate a current value of the lightning surge current from a voltage value of the waveform-modified voltage, and produce a lightning surge current calculation result, and a display unit adapted to display the lightning surge current calculation result so as to be viewable from outside under the control of the computation control unit, where the first terminal unit, the second terminal unit, the conducting coupling bar, the detection coil, the waveform processing unit, the computation control unit, and the display unit are unitized by being housed in a casing,
the surge protective device comprising:
a line-side terminal unit connected with a power line or communications line;
a ground-side terminal unit on which the first terminal unit of the lightning surge detector is detachably mounted; and
a lightning protection circuit connected between the line-side terminal unit and the ground-side terminal unit and adapted to discharge the lightning surge current entering through the line-side terminal unit to the ground-side terminal unit.

6. The surge protective device according to claim 5, wherein the lightning protection circuit includes any of:

one or more arresters, one or more varistors, and a combination of an arrester and a varistor.

7. A management system for a surge protective device, the management system comprising:

a lightning surge detector which comprises a first terminal unit, a second terminal unit connected with a ground wire, a conducting coupling bar adapted to couple the first terminal unit and the second terminal unit, a detection coil placed in a vicinity of the conducting coupling bar and adapted to output an induction current induced by a lightning surge current flowing through the conducting coupling bar, a waveform processing unit adapted to convert the induction current into a voltage, thereby generating a detection voltage, perform a stretching process on a voltage waveform of the detection voltage along a time axis, and thereby output a waveform-modified voltage, a computation control unit adapted to accept input of the waveform-modified voltage, calculate a current value of the lightning surge current from a voltage value of the waveform-modified voltage, and produce a lightning surge current calculation result, and a display unit adapted to display the lightning surge current calculation result so as to be viewable from outside under the control of the computation control unit, where the first terminal unit, the second terminal unit, the conducting coupling bar, the detection coil, the waveform processing unit, the computation control unit, and the display unit are unitized by being housed in a casing;

a surge protective device detachably outfitted with the lightning surge detector; and a monitor unit disposed next to the surge protective device and adapted to manage an operating condition and an operation history of the lightning surge detector, wherein the surge protective device comprises a line-side terminal unit connected with a power line or communications line, a ground-side terminal unit on which the first terminal unit of the lightning surge detector is detachably mounted, and a lightning protection circuit connected between the line-side terminal unit and the ground-side terminal unit and adapted to discharge the lightning surge current entering through the line-side terminal unit to the ground-side terminal unit, and the monitor unit comprises a current transformer adapted to detect the lightning surge current outputted from the second terminal unit of the lightning surge detector, a communications unit adapted to acquire the operating condition and the operation history of the lightning surge detector via communications and output the acquired operating condition and operation history to the outside via communications, a storage unit adapted to store the acquired operating condition and operation history, and a display unit adapted to display the acquired operating condition and operation history, where the current transformer, the communications unit, the storage unit, and the display unit are unitized by being housed in a casing.

* * * * *